US008420419B2

(12) United States Patent
Takagi et al.

(10) Patent No.: US 8,420,419 B2
(45) Date of Patent: *Apr. 16, 2013

(54) GROUP-III NITRIDE SEMICONDUCTOR LASER DEVICE, AND METHOD FOR FABRICATING GROUP-III NITRIDE SEMICONDUCTOR LASER DEVICE

(75) Inventors: Shimpei Takagi, Osaka (JP); Yusuke Yoshizumi, Itami (JP); Koji Katayama, Osaka (JP); Masaki Ueno, Itami (JP); Takatoshi Ikegami, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/404,310

(22) Filed: Feb. 24, 2012

(65) Prior Publication Data

US 2012/0214268 A1    Aug. 23, 2012

Related U.S. Application Data

(62) Division of application No. 12/837,291, filed on Jul. 15, 2010.

(30) Foreign Application Priority Data

Jun. 8, 2010   (JP) ............................... P2010-131404

(51) Int. Cl.
    *H01L 21/00*   (2006.01)
(52) U.S. Cl.
    USPC ............... 438/33; 438/22; 438/29; 438/460; 438/462; 257/E33.003; 257/E21.085; 257/E21.599; 372/44.011
(58) Field of Classification Search .............. 438/22, 438/29, 33, 460, 462; 257/E33.003, E21.085, 257/E21.599; 372/44.011
    See application file for complete search history.

(56) References Cited

U.S. PATENT DOCUMENTS 8,105,857 B2 *   1/2012   Takagi et al. ................... 438/33
2008/0191223 A1   8/2008   Nakamura et al.
2009/0212396 A1   8/2009   Sugiura et al.

FOREIGN PATENT DOCUMENTS

JP    61-172130    10/1986
JP    02-257687    10/1990

(Continued)

OTHER PUBLICATIONS

Nakamura, et al., "InGaN-Based Multi-Quantum-Well-Structure Laser Diodes," Japanese Journal of Applied Physics, vol. 35, part 2, No. 1B, pp. L74-L76 (1996).

(Continued)

*Primary Examiner* — Kimberly Rizkallah
*Assistant Examiner* — Maria Ligai
(74) *Attorney, Agent, or Firm* — Venable LLP; Michael A. Sartori; Tamatane J. Aga

(57) ABSTRACT

A method of fabricating a III-nitride semiconductor laser device includes: preparing a substrate product, where the substrate product has a laser structure, the laser structure includes a semiconductor region and a substrate of a hexagonal III-nitride semiconductor, the substrate has a semipolar primary surface, and the semiconductor region is formed on the semipolar primary surface; scribing a first surface of the substrate product to form a scribed mark, the scribed mark extending in a direction of an a-axis of the hexagonal III-nitride semiconductor; and after forming the scribed mark, carrying out breakup of the substrate product by press against a second region of the substrate product while supporting a first region of the substrate product but not supporting the second region thereof, to form another substrate product and a laser bar.

11 Claims, 18 Drawing Sheets

FOREIGN PATENT DOCUMENTS

| | | |
|---|---|---|
| JP | 2002-009003 | 1/2002 |
| JP | 2006-140355 | 6/2006 |
| JP | 2010-114418 | 5/2010 |
| JP | 2010-118401 | 5/2010 |
| JP | 4475357 B1 | 6/2010 |

OTHER PUBLICATIONS

Asamizu, et al., "Demonstration of 426 nm InGaN/GaN Laser Diodes Fabricated on Free-Standing Semipolar (1122) Gallium Nitride Substrates," Applied Physics Express, 1 pp. 0091102-1-091192-3 (2008).

Yamaguchi, A. Atsushi, "Anisotropic Optical Matrix Elements in Strained GaN Quantum Wells on Semipolar and Nonpolar Substrates," Japanese Journal of Applied Physics, vol. 46, No. 33, pp. L789-L791 (2007).

International Preliminary Report on Patentability and Written Opinion in PCT International Application No. PCT/JP2010/073554 dated Jan. 24, 2013.

* cited by examiner (a)

(b)

(a)

(b)

(c)

(a)

(b)

(c)

(a)

(b)

(c)

GROUP-III NITRIDE SEMICONDUCTOR LASER DEVICE, AND METHOD FOR FABRICATING GROUP-III NITRIDE SEMICONDUCTOR LASER DEVICE

CROSS-REFERENCE TO RELATED APPLICATIONS

This application is a Divisional of U.S. patent application Ser. No. 12/837,291, filed Jul. 15, 2010, which claims the benefit of Japanese Patent Application No. 2010-131404, filed Jun. 8, 2010, both of which are incorporated herein by reference in their entirety.

BACKGROUND OF THE INVENTION

1. Field of the Invention

The present invention relates to a III-nitride semiconductor laser device, and a method for fabricating the III-nitride semiconductor laser device.

2. Related Background Art

Non-patent Literature 1 describes a semiconductor laser made on a c-plane sapphire substrate. The mirror faces of the semiconductor laser are made by dry etching. It shows micrographs of the cavity mirror faces of the laser and describes that the roughness of the end faces is about 50 nm.

Non-patent Literature 2 describes a semiconductor laser made on a (11–22)-plane GaN substrate. The mirror faces of the semiconductor laser are formed by dry etching.

Non-patent Literature 3 describes a gallium nitride (GaN)-based semiconductor laser. It proposes generation of laser light polarized in an off direction of the c-axis of the substrate, in order to use m-planes of cleaved facets for the laser cavity. Specifically, this Literature describes increase of the well thickness on a nonpolar surface and decrease of the well thickness on a semipolar surface.

Non-patent Literature 1: Jpn. J. Appl. Phys. Vol. 35, (1996) L74-L76

Non-patent Literature 2: Appl. Phys. Express 1 (2008) 091102

Non-patent Literature 3: Jpn. J. Appl. Phys. Vol. 46, (2007) L789

SUMMARY OF THE INVENTION

The band structure of a GaN-based semiconductor has some possible transitions capable of lasing. According to Inventors' knowledge, it is considered that in the III-nitride semiconductor laser device using a support base that has a semipolar-plane the c-axis of which is inclined toward the m-axis, the threshold current can be lowered when the laser waveguide extends along a plane defined by the c-axis and the m-axis. When the laser waveguide extends in this orientation, a mode with the smallest transition energy (difference between conduction band energy and valence band energy) among the possible transitions becomes capable of lasing, and when this mode becomes capable of lasing on, the threshold current can be reduced.

However, this orientation of the laser waveguide does not allow use of the conventional cleaved facets such as c-planes, a-planes, or m-planes for the cavity mirrors. For this reason, the cavity mirrors have been made heretofore by forming dry-etched facets of semiconductor layers by reactive ion etching (RIE). There are now desires for improvement in the cavity mirrors formed by RIB, in terms of perpendicularity to the laser waveguide, flatness of the dry-etched facets, or ion damage. It becomes a heavy burden to derive process conditions for obtaining good dry-etched facets in the current technical level.

As far as the inventors know, no one has succeeded heretofore in achieving both of the laser waveguide extending in the inclination direction (off-axis direction) of the c-axis and the end faces for cavity mirrors formed without use of dry etching, in the single III-nitride semiconductor laser device formed on the semipolar plane.

The inventors filed a Japanese patent application (Japanese Patent Application No. 2009-144442) associated with the present invention.

The present invention has been accomplished in view of the above-described circumstances. It is an object of the present invention to provide a III-nitride semiconductor laser device with a laser cavity, enabling reduction in threshold current, on a semipolar surface of a support base inclined with respect to the c-axis toward the m-axis of a hexagonal III-nitride, and to provide a method for fabricating the III-nitride semiconductor laser device, which can improve flatness of mirrors for the optical cavity in the III-nitride semiconductor laser device and which can reduce the threshold current.

One aspect of the present invention relates to a method for fabricating a III-nitride semiconductor laser device. This method comprises the steps of: (a) preparing a substrate product having a laser structure which includes a substrate of a hexagonal III-nitride semiconductor having a semipolar primary surface, and a semiconductor region formed on the semipolar primary surface; (b) scribing a first surface of the substrate product to form a scribed mark which extends in a direction of an a-axis of the hexagonal III-nitride semiconductor; and (c) after forming the scribed mark, carrying out breakup of the substrate product by press against a second region of the substrate product while supporting a first region of the substrate product but not supporting the second region thereof, to form another substrate product and a laser bar. The substrate product is divided into the first region and the second region by a predetermined reference line; the first and second regions are adjacent to each other; the press is implemented against a second surface of the substrate product; the first surface is opposite to the second surface; the semiconductor region is located between the first surface and the substrate; the laser bar has first and second end faces extending from the first surface to the second surface and being made by the breakup; the first and second end faces constitute a laser cavity of the III-nitride semiconductor laser device; the substrate product includes an anode electrode and a cathode electrode which are provided on the laser structure; the semiconductor region includes a first cladding layer of a first conductivity type GaN-based semiconductor, a second cladding layer of a second conductivity type GaN-based semiconductor, and an active layer provided between the first cladding layer and the second cladding layer; the first cladding layer, the second cladding layer, and the active layer are arranged along an axis normal to the semipolar primary surface; a c-axis of the hexagonal III-nitride semiconductor of the substrate is inclined at an angle ALPHA with respect to the normal axis toward an m-axis of the hexagonal III-nitride semiconductor; and the first and second end faces intersect with an m-n plane defined by the normal axis and the m-axis of the hexagonal III-nitride semiconductor.

In this method, the substrate product is divided into regions, one of the regions is on one side of the substrate product and is to be supported during the breakup (the first region), and the other of the regions is on the other side of the support base and is to be pressed without being supported during the breakup (the second region). The breakup of the substrate product is implemented by the press on the other region of the support base while supporting the one region of the support base, to form the other substrate product and the laser bar. Therefore, during the supporting process prior to the press, the part of the substrate product is supported on the one side while the part of the substrate product is not supported on the other side and is left as a free end.

In the press, the second region of the substrate product is pressed so as to apply shear force along a press line on the substrate product. When this press is carried out, different forces are applied to two portions of the second region on both sides of the reference line along the press line. During a period of the press, bending moment and shear force act on the first portion between the supported first region and the pressed portion on the second region of the substrate product, whereas no bending moment is produced in the second portion and no shear force is applied thereto. For this reason, the major force to generate an end face is the shear force in the breakup by applying the shear force to the boundary between the first portion and the second portion. The method improves the flatness of the cavity mirrors in the III-nitride semiconductor laser device.

In the fabricating method according to the foregoing aspect of the present invention, the angle ALPHA can be in the range of not less than 45 degrees and not more than 80 degrees or in the range of not less than 100 degrees and not more than 135 degrees. In this fabricating method, when the angle is in the range of less than 45 degrees or in the range of more than 135 degrees, the end faces formed by press are highly likely to be composed of m-planes. When the angle falls within the range of more than 80 degrees and less than 100 degrees, desired flatness and perpendicularity are not achieved.

In the fabricating method according to the foregoing aspect of the present invention, preferably, the angle ALPHA is in the range of not less than 63 degrees and not more than 80 degrees or in the range of not less than 100 degrees and not more than 117 degrees. In this fabricating method, when the angle is in the range of less than 63 degrees or in the range of more than 117 degrees, an m-plane can appear in part of an end face made by the press. When the angle is in the range of more than 80 degrees and less than 100 degrees, the desired flatness and perpendicularity are not achieved.

In the fabricating method according to the foregoing aspect of the present invention, preferably, the scribed mark extends in a direction from the first surface to the second surface along an a-n plane defined by the normal axis and the direction of the a-axis. In this fabricating method, the scribed mark extending in the direction from the first surface to the second surface along the a-n plane guides generation of the end face.

In the fabricating method according to the foregoing aspect of the present invention, preferably, the step of forming the substrate product comprises subjecting the substrate to such processing that a thickness of the substrate becomes not less than 50 µm; the processing is slicing or grinding; the second surface is a processed surface made by the processing, or a surface including an electrode formed on the processed surface. In this fabricating method, when the substrate thickness is not less than 50 µm, handling becomes easier and production yield becomes higher. When the substrate has such thickness, the first and second end faces can be formed in excellent yield with flatness and perpendicularity enough to construct the laser cavity of the III-nitride semiconductor laser device, or without ion damage.

In the fabricating method according to the foregoing aspect of the present invention, preferably, the step of forming the substrate product comprises subjecting the substrate to such processing that the thickness of the substrate becomes not more than 115 µm. In this fabricating method, when the substrate thickness is not more than 115 µm, the substrate is more suitable for obtaining good-quality fractured faces for the laser cavity.

In the fabricating method according to the foregoing aspect of the present invention, preferably, the scribing is carried out using a laser scriber; the scribed mark comprises a scribed groove; the scribed groove extends in the direction from the first surface to the second surface along the a-n plane defined by the normal axis and the direction of the a-axis. In this fabricating method, the scribed groove extends in the direction from the first surface to the substrate. The other substrate product and the laser bar are formed by fracture of the substrate product, and propagation of the fracture is guided by the scribed groove extending in the foregoing depth direction.

In the fabricating method according to the foregoing aspect of the present invention, the semipolar primary surface can be any one of a $\{20\text{-}21\}$ plane, a $\{10\text{-}11\}$ plane, a $\{20\text{-}2\text{-}1\}$ plane, and a $\{10\text{-}1\text{-}1\}$ plane. When the III-nitride semiconductor laser device is fabricated by this fabricating method on any one of these typical semipolar planes, the first and second end faces can be provided with flatness and perpendicularity enough to construct the laser cavity of the III-nitride semiconductor laser device.

In the fabricating method according to the foregoing aspect of the present invention, the semipolar primary surface also suitably applicable is a surface with a slant in the range of not less than −4 degrees and not more than +4 degrees from any one semipolar plane of a $\{20\text{-}21\}$ plane, a $\{10\text{-}11\}$ plane, a $\{20\text{-}2\text{-}1\}$ plane, and a $\{10\text{-}1\text{-}1\}$ plane, toward the m-plane. By this fabricating method, on the slight slant surface from any one of these typical semipolar planes, the first and second end faces can be provided with flatness and perpendicularity enough to construct the laser cavity of the III-nitride semiconductor laser device.

In the fabricating method according to the foregoing aspect of the present invention, the substrate comprises any one of GaN, AlGaN, AlN, InGaN, and InAlGaN. This fabricating method can provide the first and second end faces applicable to the cavity, whereby the first and second end faces can be obtained through the use of the substrate of one of these GaN-based semiconductors.

In the fabricating method according to the foregoing aspect of the present invention, an end face of the active layer in each of the first and second end faces can make an angle with respect to a reference plane perpendicular to the m-axis of the substrate in the range of not less than (ALPHA−5) degrees and not more than (ALPHA+5) degrees on a first plane defined by the c-axis and the m-axis of the hexagonal III-nitride semiconductor. This fabricating method allows the formation of the end faces having the foregoing perpendicularity in good yield, as to the angle taken from one to the other of the c-axis and the m-axis.

In the fabricating method according to the foregoing aspect of the present invention, the angle can be in the range of not less than −5 degrees and not more than +5 degrees on a second plane perpendicular to the first plane and the normal axis. This fabricating method allows the formation of the end faces with the foregoing perpendicularity in excellent yield, as to the angle defined on the plane perpendicular to the normal axis to the semipolar plane.

The fabricating method according to the foregoing aspect of the present invention can be configured as follows: the step of forming the scribed mark comprises scribing the first surface of the substrate product to form a plurality of scribed grooves extending in the direction of the a-axis of the hexagonal III-nitride semiconductor; the plurality of scribed grooves are arrayed at a pitch of n (n=1, 2, 3, 4, . . . ) times a device width in a direction intersecting with a direction of the laser cavity. When the semipolar plane is used, quantum efficiency can be improved by reduction of the piezoelectric field and improvement in crystal quality of the light emitting layer region.

A III-nitride semiconductor laser device according to another aspect of the present invention comprises: (a) a laser structure including a support base and a semiconductor region, the support base comprising a hexagonal III-nitride semiconductor and having a semipolar primary surface, and the semiconductor region being provided on the semipolar primary surface of the support base; and (b) an electrode provided on the semiconductor region of the laser structure. The semiconductor region includes a first cladding layer of a first conductivity type GaN-based semiconductor, a second cladding layer of a second conductivity type GaN-based semiconductor, and an active layer provided between the first cladding layer and the second cladding layer; the first cladding layer, the second cladding layer, and the active layer are arranged along an axis normal to the semipolar primary surface; a c-axis of the hexagonal III-nitride semiconductor of the support base is inclined at an angle ALPHA with respect to the normal axis toward an m-axis of the hexagonal III-nitride semiconductor; the laser structure including first and second fractured faces intersecting with an m-n plane which is defined by the normal axis and the m-axis of the hexagonal III-nitride semiconductor; a laser cavity of the III-nitride semiconductor laser device includes the first and second fractured faces; the laser structure includes first and second surfaces; the first surface is opposite to the second surface; each of the first and second fractured faces extends from an edge of the first surface to an edge of the second surface; and each of the first and second fractured faces has a stripe structure extending in a direction from one to the other of the first and second surfaces on an end face of the support base.

A III-nitride semiconductor laser device according to another aspect of the present invention comprises: (a) a laser structure including the support base and a semiconductor region, the support base comprising a hexagonal III-nitride semiconductor and having a semipolar primary surface, and the semiconductor region being provided on the semipolar primary surface of the support base; and (b) an electrode provided on the semiconductor region of the laser structure. The semiconductor region includes a first cladding layer of a first conductivity type GaN-based semiconductor, a second cladding layer of a second conductivity type GaN-based semiconductor, and an active layer provided between the first cladding layer and the second cladding layer; the first cladding layer, the second cladding layer, and the active layer are arranged along an axis normal to the semipolar primary surface; a c-axis of the hexagonal III-nitride semiconductor of the support base is inclined at an angle ALPHA with respect to the normal axis toward an m-axis of the hexagonal III-nitride semiconductor; the laser structure includes first and second fractured faces intersecting with an m-n plane defined by the m-axis of the hexagonal III-nitride semiconductor and the normal axis; a laser cavity of the III-nitride semiconductor laser device includes the first and second fractured faces; the laser structure includes first and second surfaces; the first surface is opposite to the second surface; each of the first and second fractured faces extend from an edge of the first surface to an edge of the second surface; and an end face of the support base in each of the first and second fractured faces includes a sheared surface.

In the foregoing III-nitride semiconductor laser devices, because the first and second fractured faces that form the laser cavity intersect with the m-n plane defined by the m-axis of the hexagonal III-nitride semiconductor and the normal axis, it is feasible to provide a laser waveguide extending in a direction of a line of intersection between the m-n plane and the semipolar surface. Therefore, the present invention succeeds in providing the III-nitride semiconductor laser devices with the laser cavity enabling a low threshold current. When the fractured face includes the aforementioned striped surface morphology, flatness improves in and near the end face of the active layer of the cavity mirror in the III-nitride semiconductor laser device. According to Inventors' experiment, when the first and second fractured faces that constitute the laser cavity are formed by the fabricating method according to the present invention, the fractured faces have the foregoing surface morphology. The fractured faces have excellent flatness, which contributes to reduction in threshold current.

In the III-nitride semiconductor laser device according to either of the other aspects of the present invention, preferably, the angle between the normal axis and the c-axis of the hexagonal III-nitride semiconductor is in the range of not less than 45 degrees and not more than 80 degrees or in the range of not less than 100 degrees and not more than 135 degrees. In this III-nitride semiconductor laser device, when the angle is in the range of less than 45 degrees or in the range of more than 135 degrees, end faces made by press are highly likely to be comprised of m-planes. When the angle is in the range of more than 80 degrees and less than 100 degrees, it might result in failing to achieve the desired flatness and perpendicularity.

In the III-nitride semiconductor laser device according to either of the other aspects of the present invention, more preferably, a thickness of the support base is not less than 50 μm. When the thickness is not less than 50 μm, handling becomes easier and it can contribute to improvement in production yield.

In the III-nitride semiconductor laser device according to either of the other aspects of the present invention, the thickness of the support base can be not more than 115 μm. In this III-nitride semiconductor laser device, the fractured faces can be obtained for the laser cavity.

In the III-nitride semiconductor laser device according to either of the other aspects of the present invention, the semipolar primary surface can be a slight slant surface off in the range of not less than −4 degrees and not more than +4 degrees from any one plane of a {20–21} plane, a {10–11} plane, a {20–2–1} plane, and a {10–1–1} plane. This III-nitride semiconductor laser device on the slight slant surface from any one of these typical semipolar planes can provide the first and second end faces with flatness and perpendicularity enough to construct the laser cavity of the III-nitride semiconductor laser device.

In the III-nitride semiconductor laser device according to either of the other aspects of the present invention, the semipolar primary surface can be any one of a {20–21} plane, a {10–11} plane, a {20–2–1} plane, and a {10–1–1} plane. This III-nitride semiconductor laser device allows the first and second end faces to be provided with flatness and perpendicularity enough to construct the laser cavity of the III-nitride semiconductor laser device, on any one of these typical semipolar planes.

In the III-nitride semiconductor laser device according to either of the other aspects of the present invention, the support base comprises any one of GaN, AlGaN, AlN, InGaN, and InAlGaN. In this III-nitride semiconductor laser device, when the substrate used is made of any one of these GaN-based semiconductors, it becomes feasible to obtain the first and second end faces applicable to the optical cavity. Use of an AlN substrate or AlGaN substrate allows for increase in degree of polarization and enhancement of optical confinement by virtue of low refractive index. Use of an InGaN substrate allows for decrease in lattice mismatch rate between the substrate and the light emitting layer and improvement in crystal quality.

The III-nitride semiconductor laser device according to either of the other aspects of the present invention can further comprise a dielectric multilayer film provided on at least one of the first and second fractured faces. In this III-nitride semiconductor laser device, an end face coat is also applicable to the fractured faces and the end face coat allows for adjustment of reflectance.

In the III-nitride semiconductor laser device according to either of the other aspects of the present invention, the active layer can include a light emitting region provided so as to generate light at a wavelength of not less than 360 nm and not more than 600 nm. Since this III-nitride semiconductor laser device makes use of the semipolar surface, the resultant device is the III-nitride semiconductor laser device making efficient use of polarization in the LED mode and achieves a low threshold current. The light emitting region can be, for example, any one of a single quantum well structure, a multiple quantum well structure, and a bulk structure.

In the III-nitride semiconductor laser device according to either of the other aspects of the present invention, the active layer can include a quantum well structure provided so as to generate light at a wavelength of not less than 430 nm and not more than 550 nm. Since this III-nitride semiconductor laser device makes use of the semipolar surface, it allows for increase in quantum efficiency through decrease of the piezoelectric field and improvement in crystal quality of the light emitting layer region, and it is thus suitable for generation of light at the wavelength of not less than 430 nm and not more than 550 nm.

In the III-nitride semiconductor laser device according to either of the other aspects of the present invention, laser light from the active layer can be polarized in a direction of the a-axis of the hexagonal III-nitride semiconductor. In this III-nitride semiconductor laser device, a band transition allowing for achievement of a low threshold current has polarized nature. This transition can be used in the semiconductor laser device in which the c-axis is inclined toward the m-axis.

In the III-nitride semiconductor laser device according to either of the other aspects of the present invention, light in the LED mode in the III-nitride semiconductor laser device includes a polarization component I1 in a direction of the a-axis of the hexagonal III-nitride semiconductor, and a polarization component I2 in a direction of the c-axis, projected onto the primary surface, of the hexagonal III-nitride semiconductor, and the polarization component I1 is greater than the polarization component I2. Since this III-nitride semiconductor laser device is provided with the laser structure on the primary surface of the substrate the c-axis of which is inclined toward the m-axis, the laser cavity allows lasing to use emission with large emission intensity in the LED mode.

In the III-nitride semiconductor laser device according to either of the other aspects of the present invention, preferably, a stacking fault density of the support base is not more than $1\times10^4$ cm$^{-1}$. When the stacking fault density falls within this range, the flatness and/or perpendicularity of the fractured facets can be made less likely to be disturbed for a certain accidental reason.

In the III-nitride semiconductor laser device according to either of the other aspects of the present invention, preferably, an end face of the support base and an end face of the semiconductor region are exposed in each of the first and second fractured faces, and an angle between the end face of the semiconductor region in the active layer and a reference plane perpendicular to the m-axis of the support base of the hexagonal nitride semiconductor is an angle in the range of not less than (ALPHA−5) degrees and not more than (ALPHA+5) degrees on a first plane defined by the c-axis and the m-axis of the III-nitride semiconductor. This III-nitride semiconductor laser device can provide the end faces satisfying the foregoing perpendicularity, as to the angle taken from one to the other of the c-axis and the m-axis.

In the III-nitride semiconductor laser device according to either of the other aspects of the present invention, preferably, the angle is in the range of not less than −5 degrees and not more than +5 degrees on a second plane perpendicular to the first plane and the normal axis.

This III-nitride semiconductor laser device has the end faces satisfying the foregoing perpendicularity, as to the angle defined on the plane perpendicular to the normal axis to the semipolar plane.

BRIEF DESCRIPTION OF THE DRAWINGS

The above object and the other objects, features, and advantages of the present invention can more readily become clear in view of the following detailed description of the preferred embodiments of the present invention proceeding with reference to the accompanying drawings.

DETAILED DESCRIPTION OF THE PREFERRED EMBODIMENT

The expertise of the present invention can be readily understood in view of the following detailed description with reference to the accompanying drawings provided by way of illustration only. The following will describe embodiments of the III-nitride semiconductor laser device and the method for fabricating the III-nitride semiconductor laser device according to the present invention, with reference to the accompanying drawings. The same portions will be denoted by the same reference symbols, if possible.

Figure 1:
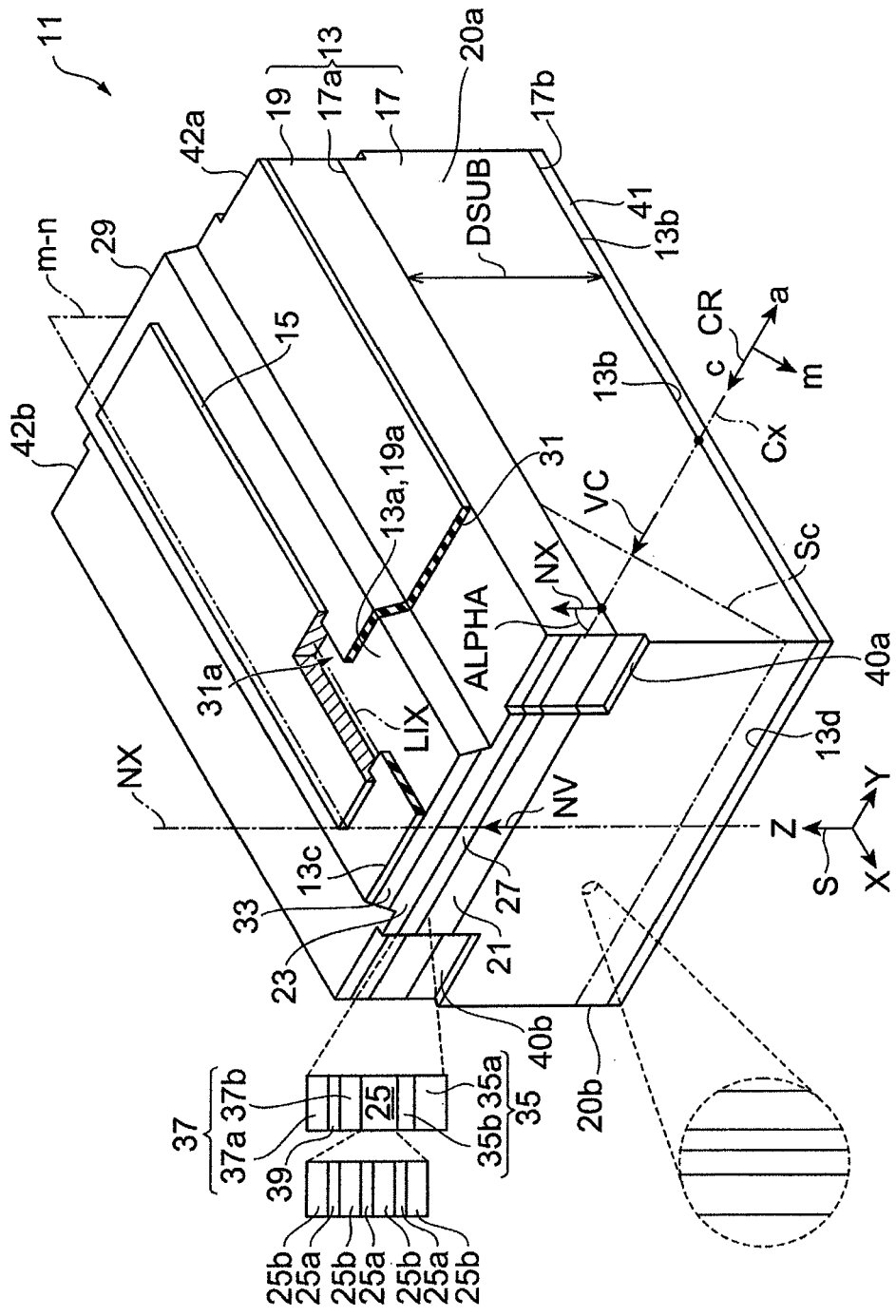
FIG. 1 is a drawing schematically showing a structure of a III-nitride semiconductor laser device according to an embodiment of the present invention.

FIG. 1 is a drawing schematically showing a structure of a III-nitride semiconductor laser device according to an embodiment of the present invention. The III-nitride semiconductor laser device 11 has a ridge structure, but embodiments of the present invention are not limited to the ridge structure. The III-nitride semiconductor laser device 11 has a laser structure 13 and an electrode 15. The laser structure 13 includes a support base 17 and a semiconductor region 19. The support base 17 comprises a hexagonal III-nitride semiconductor, and has a semipolar primary surface 17a and a back surface 17b. The semiconductor region 19 is provided on the semipolar primary surface 17a of the support base 17. The electrode 15 is provided on the semiconductor region 19 of the laser structure 13. The semiconductor region 19 includes a first cladding layer 21, a second cladding layer 23, and an active layer 25. The first cladding layer 21 comprises a first conductivity type GaN-based semiconductor, e.g., n-type AlGaN, n-type InAlGaN, or the like. The second cladding layer 23 comprises a second conductivity type GaN-based semiconductor, e.g., p-type AlGaN, p-type InAlGaN, or the like. The active layer 25 is provided between the first cladding layer 21 and the second cladding layer 23. The active layer 25 includes GaN-based semiconductor layers, and the GaN-based semiconductor layers are, for example, well layers 25a. The active layer 25 includes barrier layers 25b, which comprises a GaN-based semiconductor, and the well layers 25a and the barrier layers 25b are alternately arranged. The well layers 25a comprise, for example, InGaN or the like and the barrier layers 25b comprise, for example, GaN, InGaN, or the like. The active layer 25 can include a quantum well structure provided so as to generate light at the wavelength of not less than 360 nm and not more than 600 nm. Use of a semipolar surface is suitable for generation of light at the wavelength of not less than 430 nm and not more than 550 nm. The first cladding layer 21, the second cladding layer 23, and the active layer 25 are arranged along a normal axis NX to the semipolar primary surface 17a. In the III-nitride semiconductor laser device 11, the laser structure 13 includes a first fractured face 27 and a second fractured face 29 that intersect with an m-n plane defined by the m-axis of the hexagonal III-nitride semiconductor and the normal axis NX.

Referring to FIG. 1, an orthogonal coordinate system S and a crystal coordinate system CR are depicted. The normal axis NX is directed along a direction of the Z-axis of the orthogonal coordinate system S. The semipolar primary surface 17a extends in parallel with a predetermined plane defined by the X- and the Y-axes of the orthogonal coordinate system S. In FIG. 1, a typical c-plane Sc is also depicted. The c-axis of the hexagonal III-nitride semiconductor of the support base 17 is inclined at an angle ALPHA of a nonzero value with respect to the normal axis NX toward the m-axis of the hexagonal III-nitride semiconductor.

The III-nitride semiconductor laser device 11 further has an insulating film 31. The insulating film 31 covers a surface 19a of the semiconductor region 19 of the laser structure 13, and the semiconductor region 19 is located between the insulating film 31 and the support base 17. The support base 17 is comprised of a hexagonal III-nitride semiconductor. The insulating film 31 has an aperture 31a, and the aperture 31a extends in a direction of a line of intersection LIX between the surface 19a of the semiconductor region 19 and the foregoing m-n plane and is, for example, a stripe shape. The electrode 15 is in contact with the surface 19a of the semiconductor region 19 (e.g., a contact layer 33 of the second conductivity type) through the aperture 31a, and extends in the direction of the foregoing intersection line LIX. In the III-nitride semiconductor laser device 11, a laser waveguide includes the first cladding layer 21, the second cladding layer 23, and the active layer 25 and extends in the direction of the foregoing intersecting line LIX.

In the III-nitride semiconductor laser device 11, the first fractured face 27 and the second fractured face 29 intersect with the m-n plane defined by the m-axis of the hexagonal III-nitride semiconductor and the normal axis NX. A laser cavity of the III-nitride semiconductor laser device 11 includes the first and second fractured faces 27 and 29, and the laser waveguide extends from one to the other of the first fractured face 27 and the second fractured face 29. The laser structure 13 includes a first surface 13a and a second surface 13b, and the first surface 13a is a surface opposite to the second surface 13b. The first and second fractured faces 27 and 29 each extend from an edge 13c of the first surface 13a to an edge 13d of the second surface 13b. The first and second fractured faces 27 and 29 are different from the conventional cleaved facets such as c-planes, m-planes, or a-planes.

In this III-nitride semiconductor laser device 11, the first and second fractured faces 27 and 29 constituting the laser cavity intersect with the m-n plane. This allows for provision of the laser waveguide extending in the direction of the line of intersection between the m-n plane and the semipolar surface 17a. For this reason, the III-nitride semiconductor laser device 11 has the laser cavity enabling a low threshold current.

As shown in a dashed circle in FIG. 1, the fractured faces 27 and 29 have a striped structure extending in a direction from one to the other of the first and second surfaces 13a, 13b in end faces of the support base 17. When the fractured faces 27 and 29 include a surface morphology having the foregoing striped structure, flatness improves in and near end faces of the active layer in the optical cavity mirrors of the III-nitride semiconductor laser device 11. According to Inventors' experiment, when a production method described below is applied to production of the laser cavity, the aforementioned surface morphology is provided to the fractured faces 27 and 29 in most cases. The end face of the support base 17 in each of these fractured faces 27 and 29 can include a sheared surface. Furthermore, the end face of the semiconductor region 19 in each of these fractured faces 27 and 29 can include a sheared surface. In this case, the fractured faces 27 and 29 have excellent flatness, and this excellent flatness enables reduction in threshold current. The flatness is a technical contribution different from the band transition enabling the low threshold on the basis of the direction of the laser stripe. The improvement in flatness in the fractured faces 27 and 29 leads to improvement in performance of the laser cavity.

The striped structure in the fractured faces 27 and 29 can be observed with a scanning electron microscope or with an optical microscope, and is formed in the end faces, produced by fracture in the below-described production method, of the support base. Stripe patterns in the striped structure look like fine groove-like structures or ridge-like structures, and these structures extend in the direction from one to the other of the first and second surfaces 13a and 13b. Based on estimation of the GaN-based semiconductor made with the scanning electron microscope, the depth of the groove-like structures is, for example, in the range of about 0.05 µm to 0.50 µm and the height of the ridge-like structures is, for example, in the range of about 0.05 µm to 0.50 µm. The spacing of the stripes is, for example, in the range of about 0.5 µm to 5.0 µm.

In the III-nitride semiconductor laser device 11, the fractured face 27 has a first recess 40a. The first recess 40a extends in the direction from the first surface 13a to the second surface 13b, along the a-n plane defined by the normal axis NX and the direction of the a-axis and along a side face 20a (different from the fractured faces 27 and 29) of the III-nitride semiconductor laser device 11. This first recess 40a is formed of a scribed mark by fracture. The scribed mark extending in the direction from the first surface (epitaxial surface) 13a toward the support base 17 along the a-n plane guides directions of propagation of fracture. The first recess 40a is provided from the epitaxial surface into the support base 17. Furthermore, the first fracture face 27 has a second recess 40b, and the second recess 40b extends in the direction from the first surface 13a to the second surface 13b. The second recess 40b extends along the a-n plane and along a side face 20b (different from the fractured faces 27 and 29) of the III-nitride semiconductor laser device 11. An end face of the optical waveguide (e.g., the end face of the active layer 25) appears in the first fractured face 27, and the end face of the active layer 25 in the first fractured face 27 is located between the recesses 40a and 40b. Each of these recesses 40a and 40b is formed of a scribed mark by fracture. These scribed marks extending in the direction from the first surface (epitaxial surface) 13a toward the support base 17 along the a-n plane can guide the directions of propagation of fracture. The fractured face 29 can also have recesses 42a, 42b similar to those of the fractured face 27.

As shown in FIG. 1, the III-nitride semiconductor laser device 11 has the ridge structure. In the ridge structure, the second conductivity type contact layer 33 has a stripe shape, and the second cladding layer 23 includes a flat portion covering the underlying semiconductor layer, and a ridge portion forming a stripe shape similar to the shape of the second conductivity type contact layer 33. The III-nitride semiconductor laser device 11 includes an n-side optical guide layer 35 and a p-side optical guide layer 37. The n-side optical guide layer 35 includes a first portion 35a and a second portion 35b, and the n-side optical guide layer 35 is comprised, for example, of GaN, InGaN, or the like. The p-side optical guide layer 37 includes a first portion 37a and a second portion 37b, and the p-side optical guide layer 37 is comprised, for example, of GaN, InGaN, or the like. A carrier block layer 39 is provided, for example, between the first portion 37a and the second portion 37b. Another electrode 41 is provided on the back surface 17b of the support base 17 and the electrode 41 covers, for example, the back surface 17b of the support base 17.

Figure 2:
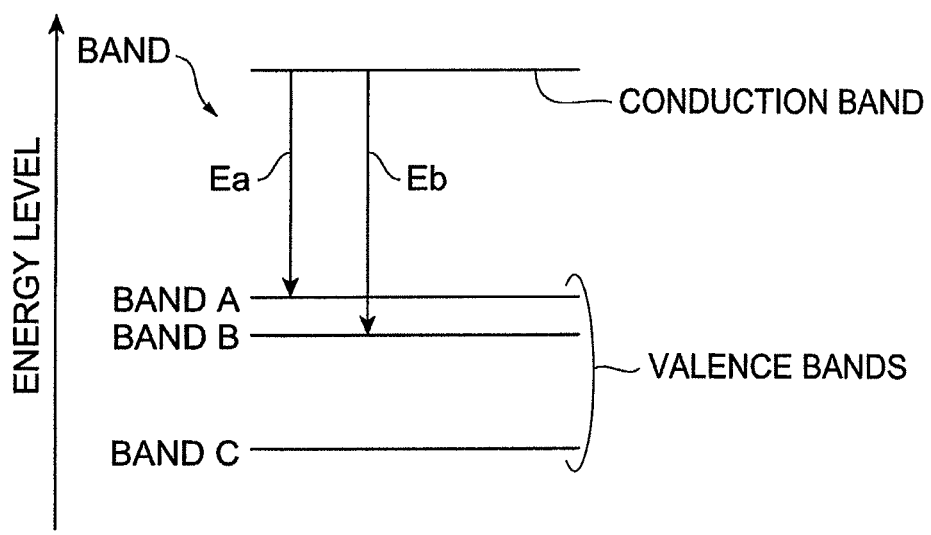
FIG. 2 is a drawing showing a band structure in an active layer in the III-nitride semiconductor laser device.
Figure 2:
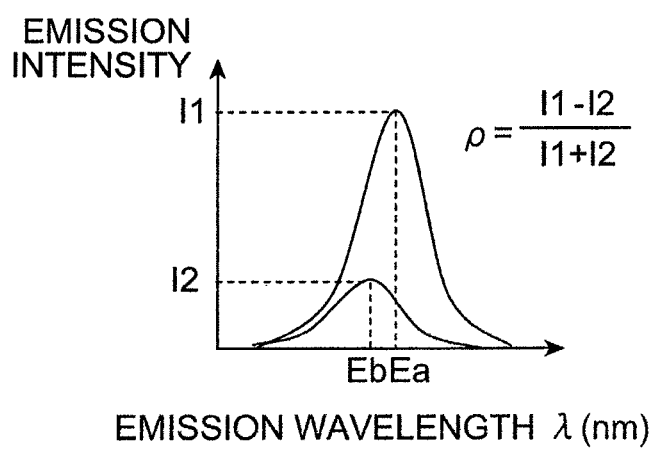
Figure 3:
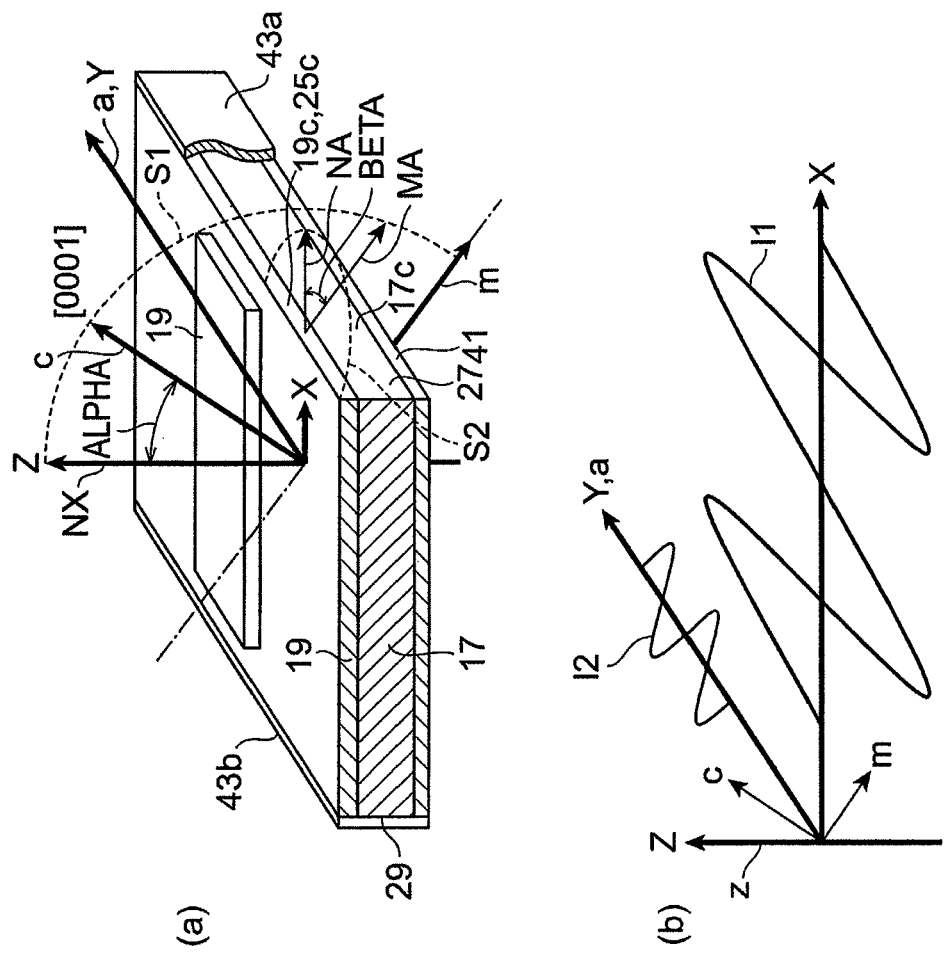
FIG. 3 is a drawing showing polarization of emission in the active layer of the III-nitride semiconductor laser device.
Figure 4:
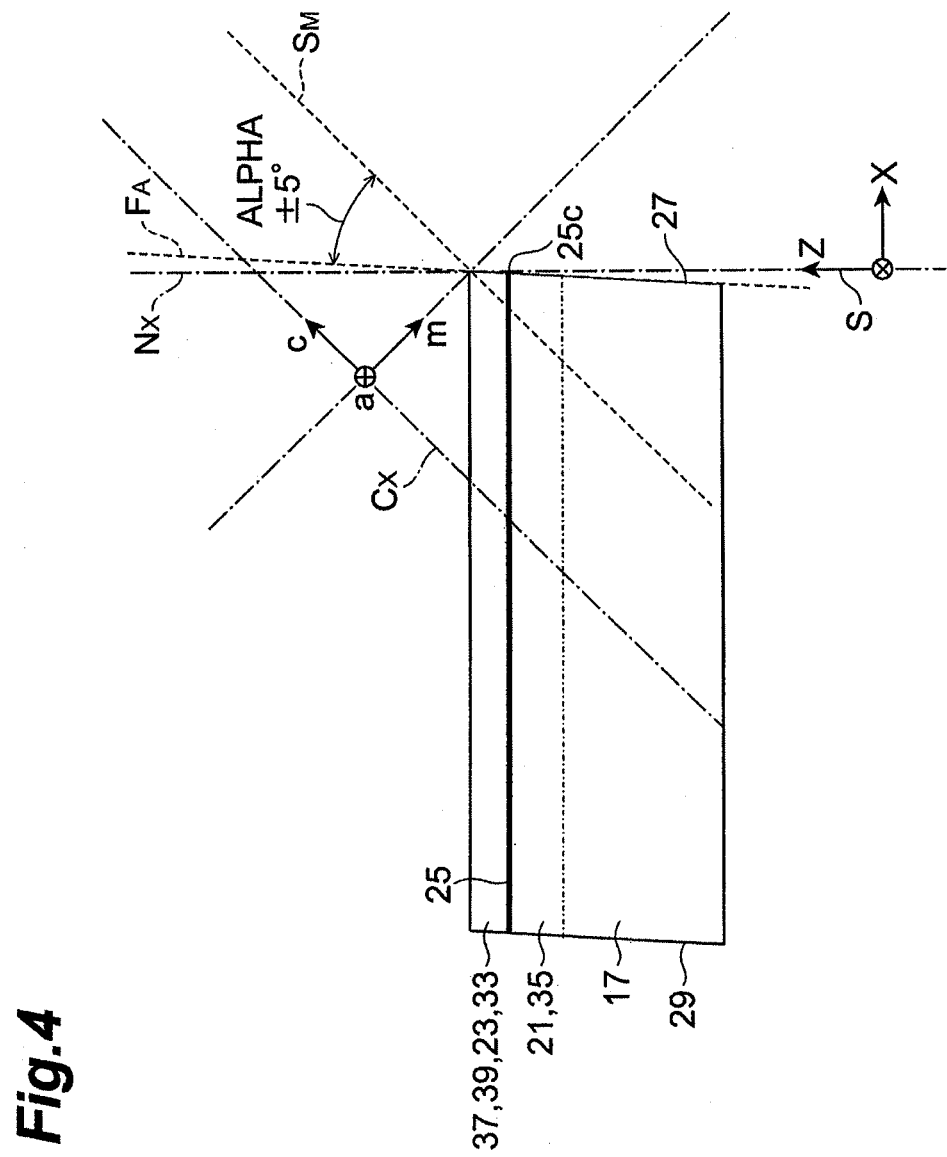
FIG. 4 is a drawing showing a relation between an end face of the III-nitride semiconductor laser device and an m-plane of the active layer.

FIG. 2 is a drawing showing a band structure in the active layer in the III-nitride semiconductor laser device. FIG. 3 is a drawing showing polarization of emission in the active layer 25 of the III-nitride semiconductor laser device 11. FIG. 4 is a drawing schematically showing a cross section defined by the c-axis and the m-axis. With reference to part (a) of FIG. 2, there are three possible transitions between the conduction band and valence bands in the vicinity of Γ point of the band structure BAND. The energy difference between band A and band B is relatively small. An emission by transition Ea between the conduction band and band A is polarized in the a-axis direction and an emission by transition Eb between the conduction band and band B is polarized in the direction of the c-axis projected onto the primary surface. Concerning lasing, a threshold of transition Ea is smaller than a threshold of transition Eb.

With reference to part (b) of FIG. 2, there are shown spectra of light in the LED mode in the III-nitride semiconductor laser device 11. The light in the LED mode includes a polarization component I1 in the direction of the a-axis of the hexagonal III-nitride semiconductor, and a polarization component I2 in the projected direction of the c-axis of the hexagonal III-nitride semiconductor onto the primary surface, and the polarization component I1 is larger than the polarization component I2. Degree of polarization ρ is defined by (I1−I2)/(I1+I2). Using the laser cavity of the III-nitride semiconductor laser device 11, the device can emit lasing light in a mode with large emission intensity in the LED mode.

As shown in FIG. 3, the device may be further provided with dielectric multilayer film 43a and 43b on at least one of the first and second fractured faces 27 and 29 or with both on the respective faces. An end face coat is also applicable to the fractured faces 27 and 29. The end face coat allows adjustment of reflectance.

As shown in part (b) of FIG. 3, the laser light L from the active layer 25 is polarized in the direction of the a-axis of the hexagonal III-nitride semiconductor. In this III-nitride semiconductor laser device 11, a band transition allowing for implementation of a low threshold current has polarized nature. The first and second fractured faces 27 and 29 for the laser cavity are different from the conventional cleaved facets, such as c-planes, m-planes, or a-planes. However, the first and second fractured faces 27 and 29 have flatness and perpendicularity enough as mirrors for the cavity. For this reason, by using the first and second fractured faces 27 and 29 and the laser waveguide extending between these fractured faces 27 and 29, as shown in part (b) of FIG. 3, it becomes feasible to achieve low-threshold lasing operation through the use of the emission by transition Ea stronger than the emission by transition Eb polarized in the projected direction of the c-axis on the primary surface.

In the III-nitride semiconductor laser device 11, an end face 17c of the support base 17 and an end face 19c of the semiconductor region 19 are exposed in each of the first and second fractured faces 27 and 29, and the end face 17c and the end face 19c are covered by the dielectric multilayer film 43a. An angle BETA between a normal vector NA to the end face 17c of the support base 17 and an end face 25c in the active layer 25, and an m-axis vector MA of the active layer 25 is defined by component $(BETA)_1$ defined on the first plane S1 that is defined by the c-axis and m-axis of the III-nitride semiconductor, and component $(BETA)_2$ defined on the second plane S2 that is perpendicular to the first plane S1 and the normal axis NX. The component $(BETA)_1$ is preferably in the range of not less than (ALPHA−5) degrees and not more than (ALPHA+5) degrees on the first plane S1 defined by the c-axis and m-axis of the III-nitride semiconductor. This angle range is shown as an angle between a typical m-plane $S_M$ and a reference plane $F_A$ in FIG. 4. The typical m-plane $S_M$ is depicted from the inside to the outside of the laser structure in FIG. 4, for easier understanding. The reference plane $F_A$ extends along the end face 25c of the active layer 25. This III-nitride semiconductor laser device 11 has the end faces satisfying the aforementioned perpendicularity, as to the angle BETA taken from one to the other of the c-axis and the m-axis. The component $(BETA)_2$ is preferably in the range of not less than −5 degrees and not more than +5 degrees on the second plane S2. Here, $BETA^2=(BETA)_1^2+(BETA)_2^2$. In this case, the end faces 27 and 29 of the III-nitride semiconductor laser device 11 satisfy the aforementioned perpendicularity as to the angle defined on the plane perpendicular to the normal axis NX to the semipolar plane 17a.

Referring again to FIG. 1, the thickness DSUB of the support base 17 is preferably not more than 400 µm in the III-nitride semiconductor laser device 11. This III-nitride semiconductor laser device is suitable for obtaining excellent-quality fractured faces for the laser cavity. In the III-nitride semiconductor laser device 11, the thickness DSUB of the support base 17 is more preferably not less than 50 µm and not more than 115 µm. This III-nitride semiconductor laser device 11 is more suitable for obtaining excellent-quality fractured faces for the laser cavity. Furthermore, handling becomes easier and the production yield becomes higher.

In the III-nitride semiconductor laser device 11, the angle ALPHA between the normal axis NX and the c-axis of the hexagonal III-nitride semiconductor is preferably not less than 45 degrees and preferably not more than 80 degrees. Furthermore, the angle ALPHA is preferably not less than 100 degrees and preferably not more than 135 degrees. When the angle is in the range of less than 45 degrees or in the range of more than 135 degrees, the end faces made by press are highly likely to be comprised of m-planes. When the angle is in the range of more than 80 degrees and less than 100 degrees, it could result in failing to achieve the desired flatness and perpendicularity.

In the III-nitride semiconductor laser device 11, more preferably, the angle ALPHA between the normal axis NX and the c-axis of the hexagonal III-nitride semiconductor is not less than 63 degrees and not more than 80 degrees. Furthermore, the angle ALPHA is more preferably not less than 100 degrees and not more than 117 degrees. When the angle is in the range of less than 63 degrees or in the range of more than 117 degrees, an m-plane can appear in part of an end face made by press. When the angle is in the range of more than 80 degrees and less than 100 degrees, it could result in failing to achieve the desired flatness and perpendicularity.

The semipolar primary surface 17a can be any one of a {20–21} plane, a {10–11} plane, a {20–2–1} plane, and a {10–1–1} plane. Furthermore, a surface with a slight slant in the range of not less than −4 degrees and not more than +4 degrees from these planes is also suitable for the primary surface. On the semipolar surface 17a of one of these typical planes, it is feasible to provide the first and second end faces 27 and 29 with flatness and perpendicularity enough to construct the laser cavity of the III-nitride semiconductor laser device 11. Furthermore, the end faces with sufficient flatness and perpendicularity are obtained in an angular range across these typical plane orientations.

In the III-nitride semiconductor laser device 11, the stacking fault density of the support base 17 can be not more than $1\times10^4$ cm$^{-1}$. Since the stacking fault density is not more than $1\times10^4$ cm$^{-1}$, the flatness and/or perpendicularity of the fractured faces is less likely to be disturbed for a certain accidental reason. The stacking fault density of the support base 17 can be estimated by the cathodoluminescence method by observing the substrate before the growth. In the cathodoluminescence, an emission process of carriers excited by an electron beam is observed and a stacking fault can be observed as a dark line, non-radiative recombination of carriers occurs in the vicinity thereof. For example, the stacking fault density can be defined as a density per unit length of dark lines (line density). The cathodoluminescence method of nondestructive measurement is applied herein in order to check the stacking fault density, but it is also possible to use a transmission electron microscope of destructive measurement. When a cross section of a sample is observed from the a-axis direction with the transmission electron microscope, a defect extending in the m-axis direction from the substrate toward the sample surface is a stacking fault contained in the support base, and the line density of stacking faults can be determined in the same manner as in the case of the cathodoluminescence method.

The support base 17 can be comprised of any one of GaN, AlN, AlGaN, InGaN, and InAlGaN. When the substrate comprised of any one of these GaN-based semiconductors is used, the end faces 27 and 29 applicable to the cavity can be obtained. When an AlN or AlGaN substrate is used, it is feasible to increase the degree of polarization and to enhance optical confinement by virtue of low refractive index. When an InGaN substrate is used, it is feasible to decrease the lattice mismatch rate between the substrate and the light emitting layer and to improve crystal quality.

Figure 5:
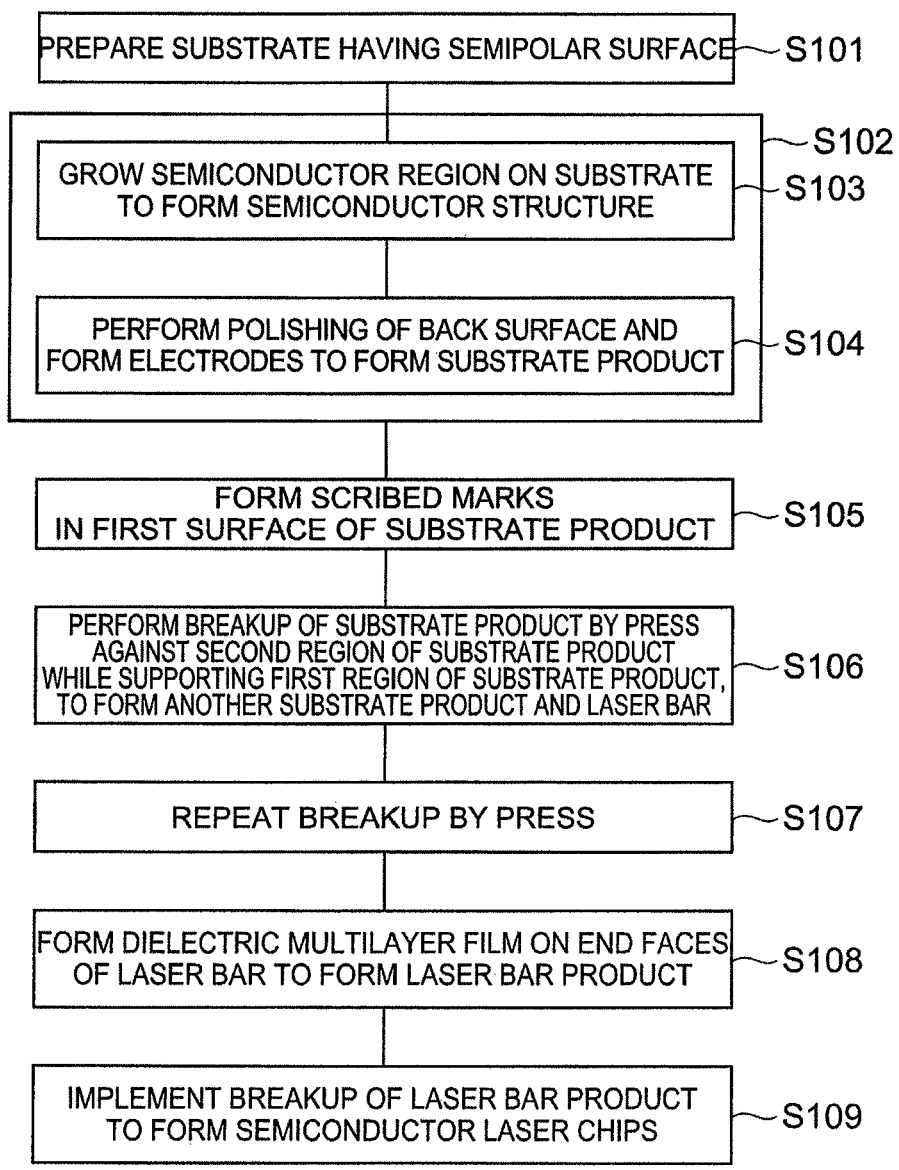
FIG. 5 is a step flowchart showing major steps in a method for fabricating a III-nitride semiconductor laser device according to an embodiment of the present invention.

FIG. 5 is a drawing showing major steps in a method of fabricating a III-nitride semiconductor laser device according to an embodiment of the present invention. With reference to part (a) of FIG. 6, a substrate 51 is shown. In Step S101 the substrate 51 is prepared for fabrication of the III-nitride semiconductor laser device. The c-axis (vector VC) of the hexagonal III-nitride semiconductor of the substrate 51 is inclined at the angle ALPHA with respect to the normal axis NX toward the m-axis (vector VM) of the hexagonal III-nitride semiconductor. For this reason, the substrate 51 has a semipolar primary surface 51a made of the hexagonal III-nitride semiconductor.

In Step S102, a substrate product SP is formed. In part (a) of FIG. 6, the substrate product SP is drawn as a member of a nearly disk-like shape, but the shape of the substrate product SP is not limited thereto. For obtaining the substrate product SP, step S103 is first carried out to form a laser structure 55. The laser structure 55 includes a semiconductor region 53 and the substrate 51, and step S103 is carried out to form the semiconductor region 53 on the semipolar primary surface 51a. For forming the semiconductor region 53, a first conductivity type GaN-based semiconductor region 57, a light emitting layer 59, and a second conductivity type GaN-based semiconductor region 61 are grown in order on the semipolar primary surface 51a. The GaN-based semiconductor region 57 can include, for example, an n-type cladding layer, and the GaN-based semiconductor region 61 can include, for example, a p-type cladding layer. The light emitting layer 59 is provided between the GaN-based semiconductor region 57 and the GaN-based semiconductor region 61, and can include an active layer, optical guide layers, an electron block layer, and so on. The first conductivity type GaN-based semiconductor region 57, the light emitting layer 59, and the second conductivity type GaN-based semiconductor region 61 are arranged along the axis NX normal to the semipolar primary surface 51a. These semiconductor layers are epitaxially grown. The surface of the semiconductor region 53 is covered with an insulating film 54. The insulating film 54 is made, for example, of silicon oxide. The insulating film 54 has an aperture 54a. The aperture 54a is, for example, a stripe shape.

In Step S104 an anode electrode 58a and a cathode electrode 58b are formed on the laser structure 55. Before forming the electrode on the back surface of the substrate 51, the back surface of the substrate used in crystal growth is polished to form a substrate product SP in a desired thickness DSUB. In formation of the electrodes, for example, the anode electrode 58a is formed on the semiconductor region 53, and the cathode electrode 58b is formed on the back surface (polished surface) 51b of the substrate 51. The anode electrode 58a extends in the X-axis direction, and the cathode electrode 58b covers the entire area of the back surface 51b. These steps result in forming the substrate product SP. The substrate product SP includes a first surface 63a, and a second surface 63b located opposite thereto. The semiconductor region 53 is located between the first surface 63a and the substrate 51.

Figure 6:
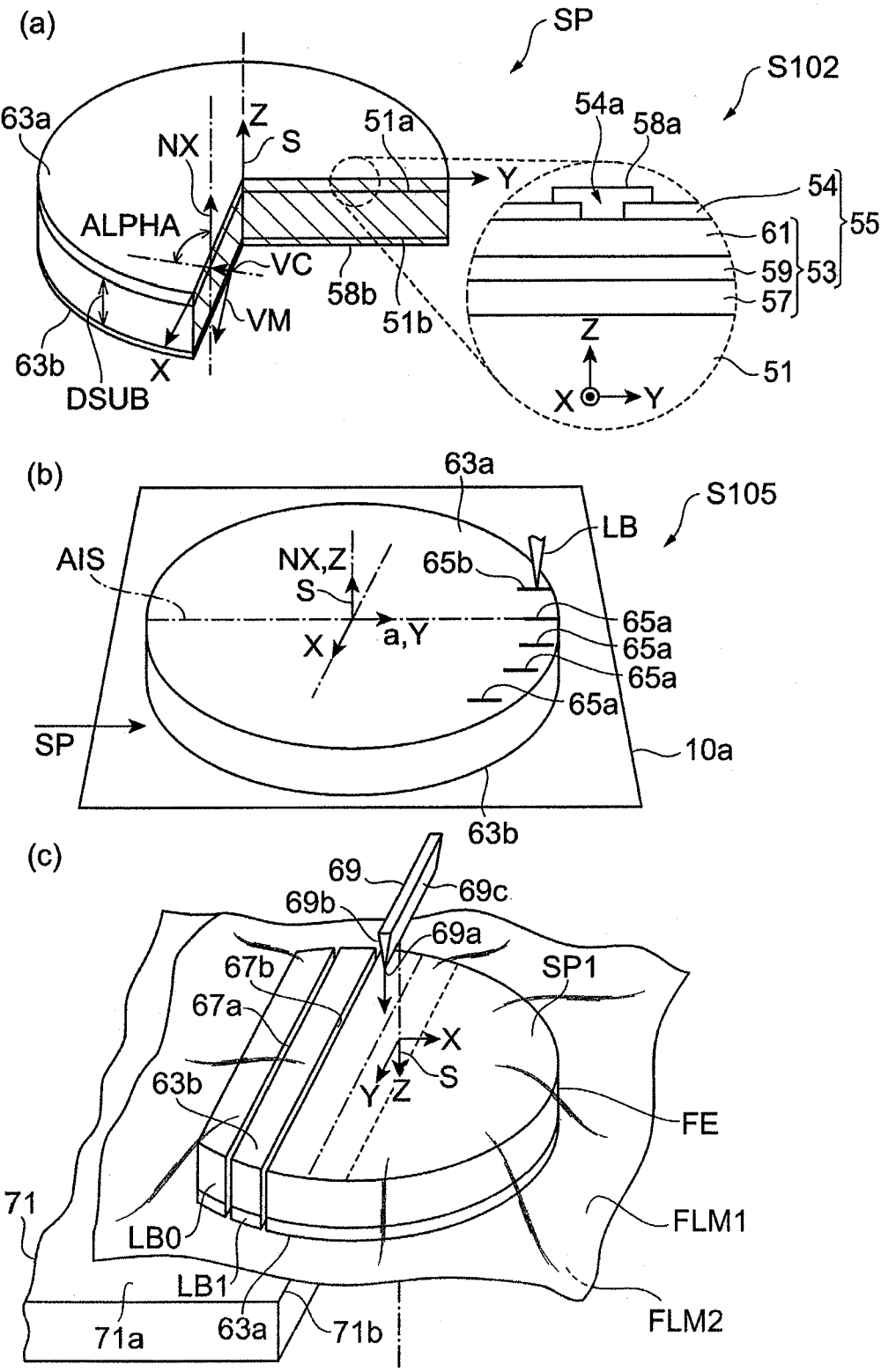
FIG. 6 is a drawing schematically showing major steps in the method for fabricating the III-nitride semiconductor laser device according to the embodiment.

As shown in part (b) of FIG. 6, in Step S105, the first surface 63a of the substrate product SP is scribed. This scribing step is carried out with a laser scriber 10a. This scribing step results in forming scribed grooves 65a. In part (b) of FIG. 6, five scribed grooves are already formed, and formation of a scribed groove 65b is in progress with a laser beam LB. The length of the scribed grooves 65a is shorter than the length of an intersecting line AIS between the first surface 63a and the a-n plane that is defined by the normal axis NX and the a-axis of the hexagonal. III-nitride semiconductor, and the laser beam LB is applied to a part of the intersecting line AIS. By the application with the laser beam LB, grooves extending in the specific direction and reaching the semiconductor region are formed in the first surface 63a. The scribed grooves 65a can be formed, for example, at an edge of the substrate product SP. The scribed grooves 65a extend in the direction from the first surface 63a to the second surface 63b along the a-n plane. The scribed grooves 65a extend in the direction from the first surface 63a toward the substrate 51. Another substrate product and a laser bar are formed from the substrate product SP by press on the substrate product SP, and propagation of the fracture is guided by the scribed grooves 65a extending in the aforementioned depth direction. In part (b) of FIG. 6, the substrate product is depicted in the disk-like shape, but the shape of the substrate product is not limited to this.

In part (c) of FIG. 6, a laser bar LB0 is already formed. Prior to the press, the substrate product SP is placed between two films with flexibility (e.g., flexible films) FLM1 and FLM2, and the flexible films applicable herein are, for example, polyvinyl chloride films or the like. The press is implemented using a breaking device 69, e.g., a blade. The breaking device 69 includes an edge 69a extending in one direction, and at least two blade faces 69b and 69c defining the edge 69a. The press on the substrate product SP1 is carried out on a support device 71. The support device 71 includes a support table 71a and an edge 71b, and the support table 71a ends at the edge 71b. This support device 71 enables the substrate product SP1 to be supported in a cantilevered state. In part (c) of FIG. 6, the substrate product is supported so that the laser bars successively formed are located on the support table 71a, but it is also possible to adopt a configuration in which the substrate product is supported so that substrate products successively formed are located on the support table 71a.

In step S106, as shown in part (c) of FIG. 6, breakup of the substrate product is brought about by press against the second surface 63b of this substrate product, thereby forming a substrate product SP1 and a laser bar LB1. The orientation of the scribed groove 65a of the substrate product SP1 is aligned with the direction in which the edge 71b of the support device 71 extends, and the substrate product SP is positioned on the basis of the edge 71b of the support device 71. The scribed groove 65a to cause next fracture is not positioned on the support table 71a.

The foregoing breakup will be described below with reference to FIG. 7. As shown in part (a) of FIG. 7, the substrate product SP is divided into a first region 70a and a second region 70b with respect to the reference line (X-coordinate A1) that extends along the edge 71b. In the substrate product SP, the first region 70a and the second region 70b are adjacent to each other, the first region 70a includes the entire part on one side of the substrate product SP defined by the reference line (X-coordinate A1), and the second region 70b includes the entire part on the other side of the substrate product SP defined by the reference line.

The breakup of the substrate product SP by the press on the second region 70b is implemented while supporting the first region 70a by the support device 71 but not supporting the second region 71b, to form the other substrate product SP1 and the laser bar LB1. The direction of the edge 69a of the breaking device 69 is aligned with the direction that the edge 71b extends, and the edge 69a of the breaking device 69 is pressed on the substrate product SP from a direction intersecting with the second surface 63b. The intersecting direction is preferably a direction substantially perpendicular to the second surface 63b. The press results in breaking the substrate product to form the other substrate product SP1 and the laser bar LB1. The press forms the laser bar LB1 having first and second end faces 67a and 67b, and the end faces of the laser waveguide in these end faces 67a and 67b have perpendicularity and flatness enough to be applicable to the cavity mirrors of the semiconductor laser.

Figure 7:
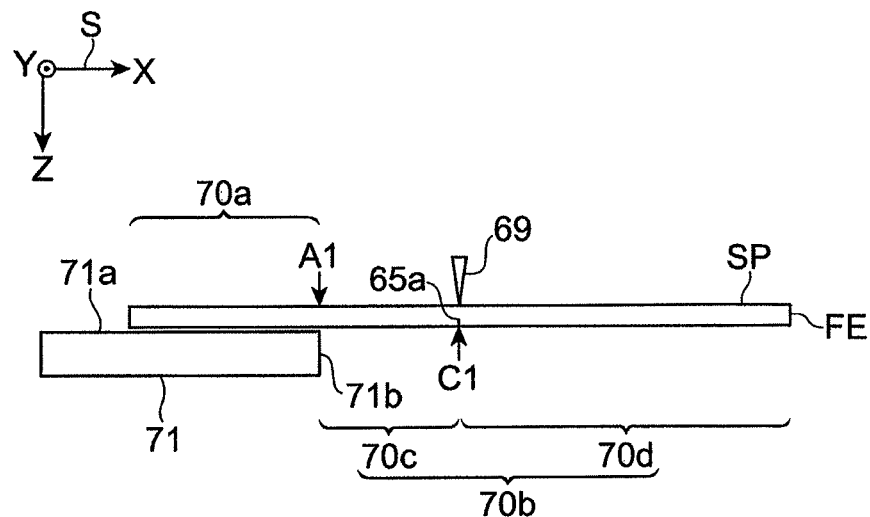
FIG. 7 is a drawing illustrating method (A) of fracture in the method for fabricating the III-nitride semiconductor laser device according to the embodiment.
Figure 7:
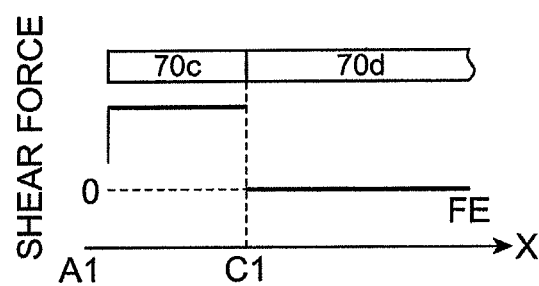
Figure 7:
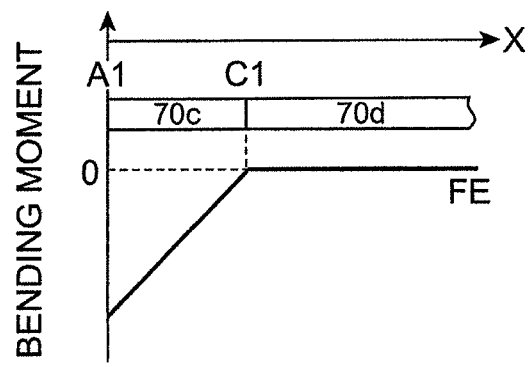

In the laser bar producing method shown in part (a) of FIG. 7 (referred to as "method A"), the substrate product SP consists of the two regions separated by the reference line (X-coordinate A1). After formation of the scribed marks in this substrate product SP, the substrate product SP is positioned on the support device 71 such that the support table 71a does not support the surface opposite to the coordinate (near X-coordinate C1) of the surface 63a at which the scribed mark is provided. After the positioning, the breakup of the substrate product SP is brought about by the press along the press line (X-coordinate C1) on the other-side region 70b of the substrate product SP while supporting the one-side region 70a of the substrate product SP, whereby the other substrate product SP1 and the laser bar LB1 are formed as shown in part (c) of FIG. 6. In the supporting process prior to the foregoing press, the one-side region 70a of the substrate product SP is supported, while the other-side region 70b of the substrate product SP is not supported so as to be left as a free end FE.

When the press is carried out so as to press the other-side region 70b of the substrate product SP with the blade edge being aligned with the press line, different forces are applied to two portions in the second region 70b with respect to the press line, as understood from the description below. For explaining this, the second region 70b is divided into first and second portions 70c and 70d with respect to the press line (X-coordinate C1), and the first portion 70c in the second region 70b is adjacent to the second portion 70d in the second region 70b and to the first region 70a and is located between them. The foregoing press applies shear force to the boundary line between the first portion 70c and the second portion 70d. During the period of the press, as schematically shown in parts (b) and (c) of FIG. 7, the bending moment and shear force both act on the first portion 70c located between the supported first region 70a and the press line defined on the second region 70b of the substrate product SP, whereas neither bending moment nor shear force acts on the second portion 70d. This fracture method improves the flatness in the cavity mirrors and produces a morphology characteristic of the fracture by shear force (e.g., part (a) of FIG. 9), in the fractured face. Part (c) of FIG. 7 shows that the bending moment monotonically decreases in a direction from the applying line, which shear force is applied at, to the edge 71b of the single support body of the support device 71. This bending moment is directed in a direction not to contribute to the fracture in the vicinity of the press line. Deformation of the substrate product caused by the press is sufficiently small at the position of the applying line and the curvature of the substrate product is upwardly convex. Parts (b) and (c) of FIG. 7 are based on the assumption that the bending moment linearly varies in the substrate product, for easier understanding, but the variation of bending moment does not have to be limited to this example.

Figure 8:
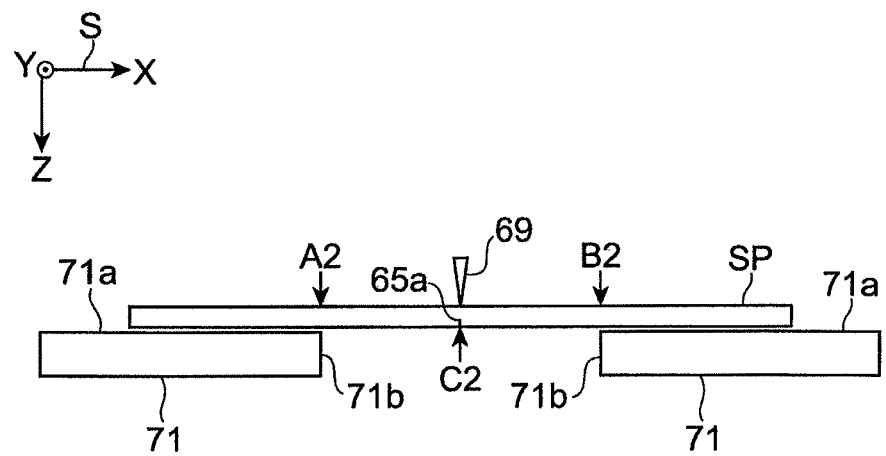
FIG. 8 is a drawing illustrating method (B) of fracture in the method for fabricating the III-nitride semiconductor laser device according to the embodiment.
Figure 8:
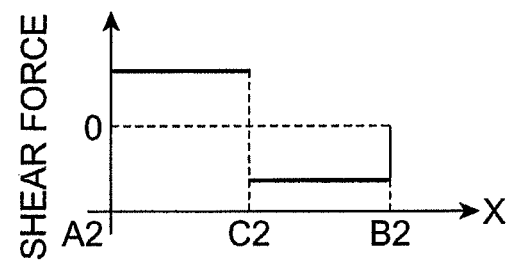
Figure 8:
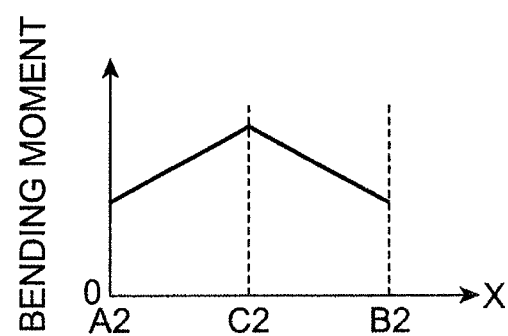

On the other hand, in a laser bar producing method shown in part (a) of FIG. 8 (referred to as "method B"), the substrate product SP is supported on both sides thereof, and the substrate product SP is supported by two support bodies spaced by a distance D between two edges 71b (X-coordinates A2 and B2). The press is carried out at a position (X-coordinate C2) equal to half (D/2) of the distance D. As shown in part (b) of FIG. 8, the shear stress is applied in opposite directions on two sides of the press line (X-coordinate C2). As shown in part (c) of FIG. 8, the bending moment is applied on both sides of the press line (X-coordinate C2), and it takes a maximum at the press line (X-coordinate C2) and decreases from the maximum toward the two edges 71b (X-coordinates A2, B2). This bending moment is directed in a direction to contribute to the fracture. Deformation of the substrate product by the press is sufficiently large at the position of the applying line and the curvature of the substrate product is downwardly concave. Therefore, the fracture is caused by the bending moment and shear force. It is shown by comparison between FIGS. 7 and 8 that the distributions of bending moment and shear force in the substrate product SP are different from each other between the two methods of producing a laser bar.

The difference between principles of the producing methods using method (A) and method (B) will be described below with reference to FIGS. 7 and 8.

In method (B), the bending moment distribution has the maximum immediately below the blade (at the X-coordinate C2). It is, therefore, considered that in method (B), tensile stress caused by the load of bending moment acts on the substrate so as to develop the break to produce the laser bar.

On the other hand, in method (A), the bending moment becomes zero immediately below the blade. The bending moment increases from the center of the blade toward the edge (bed knife) of the support table of the breaking device, but stress on the semiconductor epitaxial region by this bending moment is compressive stress, with no contribution to development of the break. The shear force acts at constant magnitude from the position at the center of the blade to the edge of the support table (bed knife). It is, therefore, considered that in method (A), the shear force acts on the substrate so as to develop the break to produce the laser bar.

This is consistent with the fact that the striped morphology characteristic of shear fracture is formed in the end face produced by shear force. The striped morphology can be observed with an optical microscope, extends from below the semiconductor epitaxial region to the back surface of the substrate, and supports the above-described mechanism of the break.

The laser bar LB1 thus formed has the first and second end faces 67a and 67b formed by the aforementioned breakup, and each of the end faces 67a and 67b extends from the first surface 63a to the second surface 63b. For this reason, the end faces 67a and 67b form the laser cavity of the III-nitride semiconductor laser device and intersect with the XZ plane. This XZ plane corresponds to the m-n plane defined by the normal axis NX and the m-axis of the hexagonal III-nitride semiconductor.

According to this method, the first surface 63a of the substrate product SP is scribed in the direction of the a-axis of the hexagonal III-nitride semiconductor, and thereafter the breakup of the substrate product SP is carried out by the press against the second surface 63b of the substrate product SP, thereby forming the new substrate product SP1 and the laser bar LB1. For this reason, the first and second end faces 67a and 67b are formed in the laser bar LB1 so as to intersect with the m-n plane. This end face forming method provides the first and second end faces 67a and 67b with flatness and perpendicularity enough to construct the laser cavity of the III-nitride semiconductor laser device.

In this method, the laser waveguide formed extends in the direction of inclination of the c-axis of the hexagonal III-nitride. The mirror end faces for the cavity allowing for provision of this laser waveguide are formed without use of dry-etched facets.

This method involves the fracture of the substrate product SP, thereby forming the new substrate product SP1 and the laser bar LB1. In Step S107, the breakup by the press is carried out repeatedly to produce many laser bars. This fracture is brought about using the scribed groove 65a shorter than a fracture line BREAK of the laser bar LB1.

In Step S108, dielectric multilayer films is formed on the end faces 67a and 67b of the laser bar LB1 to fabricate a laser bar product. In Step S109, this laser bar product is broke into chips of individual semiconductor lasers.

In the fabrication method according to the present embodiment, the angle ALPHA can be in the range of not less than 45 degrees and not more than 80 degrees or in the range of not less than 100 degrees and not more than 135 degrees. When the angle is in the range of less than 45 degrees or in the range of more than 135 degrees, the end face made by press becomes highly likely to be comprised of an m-plane. When the angle is in the range of more than 80 degrees and less than 100 degrees, it could result in failing to achieve the desired flatness and perpendicularity. More preferably, the angle ALPHA can be in the range of not less than 63 degrees and not more than 80 degrees or in the range of not less than 100 degrees and not more than 117 degrees. When the angle is in the range of less than 45 degrees or in the range of more than 135 degrees, an m-plane can appear in part of an end face formed by press. When the angle is in the range of more than 80 degrees and less than 100 degrees, it could result in failing to achieve the desired flatness and perpendicularity. The semipolar primary surface 51a can be any one of a {20-21} plane, a {10-11} plane, a {20-2-1} plane, and a {10-1-1} plane. Furthermore, a surface with a slight slant in the range of not less than −4 degrees and not more than +4 degrees from these planes is also suitable for the primary surface. On these typical semipolar planes, it is feasible to provide the end faces for the laser cavity with flatness and perpendicularity enough to construct the laser cavity of the III-nitride semiconductor laser device.

The substrate 51 can be comprised of any one of GaN AlN, AlGaN, InGaN, and InAlGaN. When the substrate used is comprised of any one of these GaN-based semiconductors, it is feasible to obtain the end faces applicable to the laser cavity. The substrate 51 is preferably comprised of GaN.

In the step S104 of forming the substrate product SP, the semiconductor substrate used in crystal growth can be one subjected to processing such as slicing or grinding so that the substrate thickness becomes not more than 400 µm, and the second surface 63b is a processed surface formed by polishing. In this substrate thickness, the end faces 67a and 67b can be formed in excellent yield, with flatness and perpendicularity enough to construct the laser cavity of the III-nitride semiconductor laser device or without ion damage. More preferably, the second surface 63b is a polished surface formed by polishing and the substrate thickness after polishing is not more than 115 µm. For relatively easily handling the substrate product SP, the substrate thickness is preferably not less than 50 µm.

In the production method of the laser end faces according to the present embodiment, the angle BETA explained with reference to FIG. 3 is also defined in the laser bar LB1. In the laser bar LB1, the component $(BETA)_1$ of the angle BETA is preferably in the range of not less than (ALPHA−5) degrees and not more than (ALPHA+5) degrees on the first plane (plane corresponding to the first plane S1 in the description with reference to FIG. 3) that is defined by the c-axis and m-axis of the III-nitride semiconductor. The end faces 67a and 67b of the laser bar LB 1 satisfy the aforementioned perpendicularity as to the angle component of the angle BETA taken from one to the other of the c-axis and the m-axis. The component $(BETA)_2$ of the angle BETA is preferably in the range of not less than −5 degrees and not more than +5 degrees on the second plane (plane corresponding to the second plane S2 shown in FIG. 3). In this case, the end faces 67a and 67b of the laser bar LB 1 satisfy the aforementioned perpendicularity as to the angle component of the angle BETA defined on the plane perpendicular to the normal axis NX to the semipolar plane 51a.

The end faces 67a and 67b are formed by break by press against the plurality of GaN-based semiconductor layers epitaxially grown on the semipolar plane 51a. Since they are epitaxial films on the semipolar plane 51a, the end faces 67a, 67b are not cleaved facets with a low plane index like c-planes, m-planes, or a-planes which have been used heretofore for the conventional cavity mirrors. However, through the break of the stack of epitaxial films on the semipolar plane 51a, the end faces 67a, 67b have the flatness and perpendicularity applicable as cavity mirrors.

Example 1

A semipolar-plane GaN substrate is prepared, and perpendicularity of a fractured face is observed as described below. The substrate used is a {20–21}-plane GaN substrate, which is cut at the angle of 75 degrees toward the m-axis out of a (0001) GaN ingot thickly grown by HVPE. The primary surface of the GaN substrate is mirror-finished and the back surface was in a ground pear-skin state. The thickness of the substrate is 370 µm.

On the back side in the pear-skin state, a scribe line is formed, perpendicularly to the direction of the c-axis projected onto the primary surface of the substrate, with a diamond pen, and thereafter the substrate is fractured by the press according to the method shown in FIG. 7.

Figure 9:
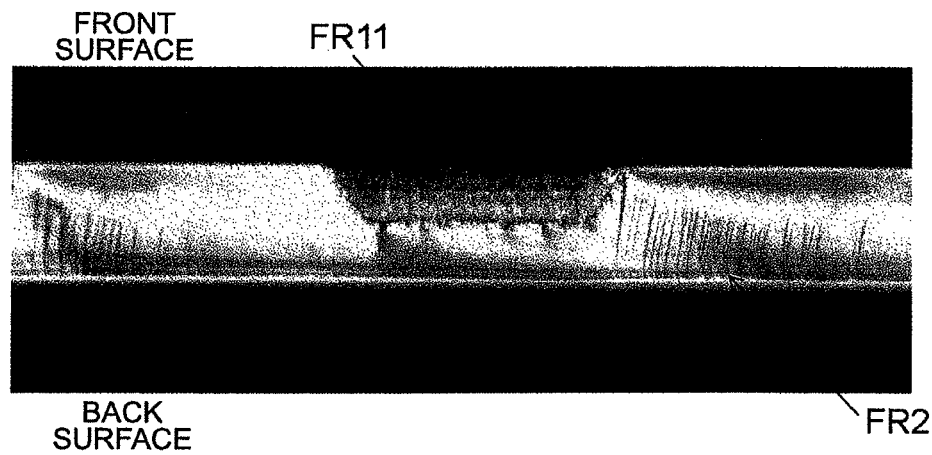
FIG. 9 is a drawing showing an optical microscope image of a cavity end face, along with a {20–21} plane in crystal lattices.
Figure 9:
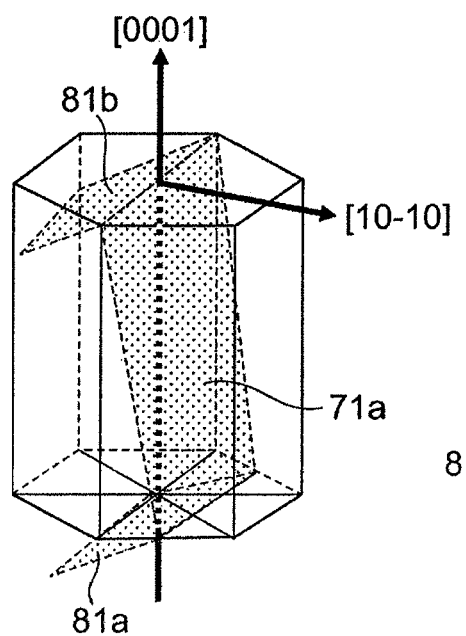
Figure 9:
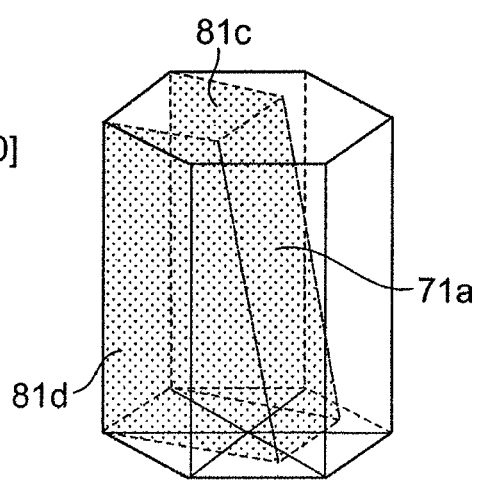

Part (a) of FIG. 9 shows an optical microscope image obtained by observing the fractured face from the front side. According to Inventors' observation of the microscope image and other experiment results, the fractured face has excellent flatness and perpendicularity to the semipolar primary surface. Particularly, the fractured face exhibits excellent flatness around the small area of the waveguide. With reference to part (a) of FIG. 9, a recess formed of the scribed mark is shown in area FR1. Furthermore, a striped structure in the fractured face is shown in area FR2. Stripe patterns in the striped structure look like fine groove-like structures or fine ridge-like structures, and these structures extend in the direction from one to the other of the epitaxial surface and the back surface of the substrate. This striped structure has a striped morphology characteristic of shear fracture and indicates that the break mechanism by fracture in the present example is based on shear force. This striped morphology can be observed with an optical microscope, and is characterized in that it extends from below the semiconductor epitaxial region to the back surface of the substrate. According to estimation with a scanning electron microscope, the depth of the groove-like structures is, for example, in the range of about 0.05 µm to 0.50 µm, and the height of the ridge-like structures is, for example, in the range of about 0.05 µm to 0.50 µm. The spacing of the stripes is, for example, in the range of about 0.5 µm to 5.0 µm.

A region around the end face of the active layer in the fractured face formed by the break is observed with a scanning electron microscope, and no prominent unevenness is observed therein. From this result, the flatness (magnitude of unevenness) of the region around the end face of the active layer is evaluated to be not more than 20 nm. Furthermore, the perpendicularity of the fractured face to the sample surface is in the range of −5 degrees to +5 degrees.

Example 2

Figure 10:
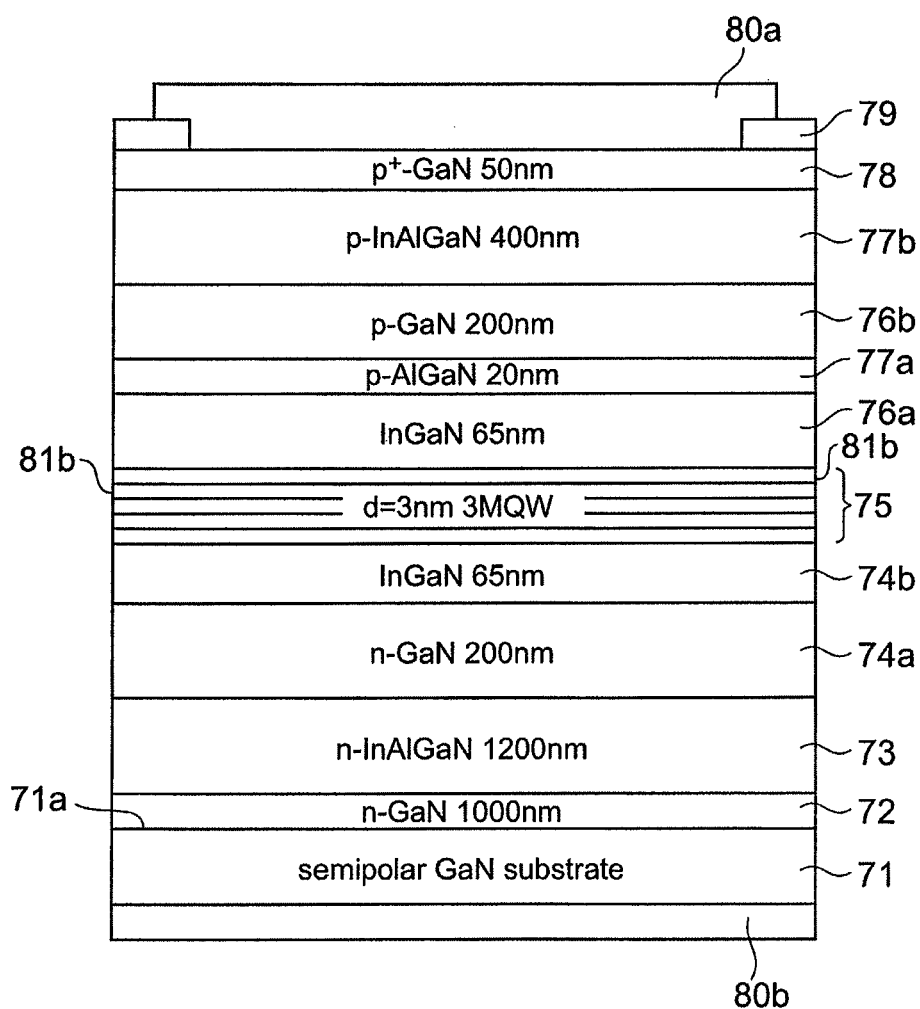
FIG. 10 is a drawing showing a structure of a laser diode shown in Example.

It is found in Example 1 that the fractured face, which is obtained by drawing the scribe line perpendicular to the projected direction of the c-axis onto the primary surface of the substrate and pressing the substrate, has the flatness and perpendicularity to the primary surface of the substrate in the GaN substrate having the semipolar {20–21} plane. For checking applicability of this fractured face to the laser cavity, a laser diode shown in FIG. 10 is grown by metal-organic vapor phase epitaxial as described below. The raw materials used are as follows: trimethyl gallium (TMGa); trimethyl aluminum (TMAl); trimethyl indium (TMIn); ammonia ($NH_3$); and silane ($SiH_4$). A substrate 71 is prepared. The substrate 71 prepared is a GaN substrate cut with a wafer slicing device at an angle in the range of 0 degrees to 90 degrees toward the m-axis out of a (0001) GaN ingot, thickly grown by HVPE, in such a manner that the angle ALPHA of inclination of the c-axis toward the m-axis has a desired off angle in the range of 0 degrees to 90 degrees. For example, when the substrate is cut at the angle of 75 degrees, the resultant substrate is a {20–21}-plane GaN substrate and it is represented by reference symbol 71a in the hexagonal crystal lattice shown in part (b) of FIG. 7.

This substrate 71 is placed on a susceptor in a reactor, and the epitaxial layers are grown according to the following growth procedure. First, n-type GaN 72 is grown in the thickness of 1000 nm. Next, an n-type InAlGaN cladding layer 73 is grown in the thickness of 1200 nm. Thereafter, an n-type GaN guide layer 74a and an undoped InGaN guide layer 74b are grown in the thickness of 200 nm and in the thickness of 65 nm, respectively, and then a three-cycle MQW 75 of GaN 15 nm thick/InGaN 3 nm thick is grown thereon. Subsequently grown are an undoped InGaN guide layer 76a in the thickness of 65 nm, a p-type AlGaN block layer 77a in the thickness of 20 nm, and a p-type GaN guide layer 76b in the thickness of 200 nm. Then, a p-type InAlGaN cladding layer 77b is grown in the thickness of 400 nm. Finally, a p-type GaN contact layer 78 is grown in the thickness of 50 nm.

An insulating film 79 of $SiO_2$ is deposited on the contact layer 78, and then photolithography is used to form a stripe window WIN in the width of 10 µm by wet etching. In this step, two types of contact windows are formed along two stripe directions, respectively. They extend along (1) M-direction (direction of the contact window extending along the predetermined plane defined by the c-axis and the m-axis), and along (2) A-direction: <11–20> direction.

After the formation of the stripe window, a p-side electrode 80a of Ni/Au and a pad electrode of Ti/Al are made by vapor deposition. Next, the back surface of the GaN substrate (GaN wafer) is polished using a diamond slurry to produce a substrate product with the back surface in a mirror state. At this time, the thickness of the substrate product is measured with a contact film thickness meter. The measurement of thickness may also be carried out based on a sample cross section with a microscope. The microscope applicable herein is an optical microscope or a scanning electron microscope. An n-side electrode 80b of Ti/Al/Ti/Au is formed by vapor deposition on the back surface (polished surface) of the GaN substrate (GaN wafer).

The cavity mirrors for these two types of laser stripes are produced with a laser scriber using the YAG laser having the wavelength of 355 nm. When the break is implemented with the laser scriber, the lasing chip yield can be improved as compared with the case using the diamond scribing method. The conditions for formation of the scribed grooves are as follows: laser beam output of 100 mW; scanning speed of 5 mm/s. The scribed grooves thus formed have, for example, the length of 30 µm, the width of 10 µm, and the depth of 40 µm. The scribed grooves are formed by applying the laser beam directly to the epitaxially grown surface at the pitch of 800 µm and through the aperture of the insulating film of the substrate. The cavity length is 600 µm.

After formation of the scribed marks, a laser bar is produced from the substrate product, using the breaking device. The position of the scribed groove is aligned with the center position of the breaking blade, and the blade is pressed from the back surface of the substrate of the substrate product to produce the laser bar. On that occasion, the laser bar is prepared by the following two methods.

"Method A": method of pressing the blade against the back surface of the substrate of the substrate product while supporting the epitaxial surface only on one side of the substrate product by the support table of the breaking device (e.g., a bed knife).

"Method B": method of pressing the blade against the back surface of the substrate of the substrate product while supporting the epitaxial surface on both sides of the substrate product by the support table of the breaking device (e.g., bed knives).

In the both methods, the distance between the center of the breaking blade and the edge of the support table (bed knife) is 450 µm.

The cavity mirrors are made by fracture using the blade. A laser bar is produced by breaking the substrate product by the press against the back side of the substrate. More specifically, part (b) of FIG. 9 and part (c) of FIG. 9 show relations between crystal orientations and laser end faces, for the {20–21}-plane GaN substrate. Part (b) of FIG. 9 shows the case where the laser stripe is provided in the direction in which the m-axis is inclined in accordance with the present example, and shows end faces 81a and 81b for the laser cavity along with the semipolar plane 71a. The end faces 81a and 81b are approximately perpendicular to the semipolar plane 71a, but are different from the conventional cleaved facets such as the hitherto-used c-planes, en-planes, or a-planes. The direction of the laser stripe is different from that shown in part (c) of FIG. 9. Part (c) of FIG. 9 shows the case where the laser stripe is provided in the a-axis direction, and shows end faces 81c and 81d for the laser cavity along with the semipolar plane 71a. The end faces 81c and 81d are approximately perpendicular to the semipolar plane 71a and are composed of a-planes.

Figure 11:
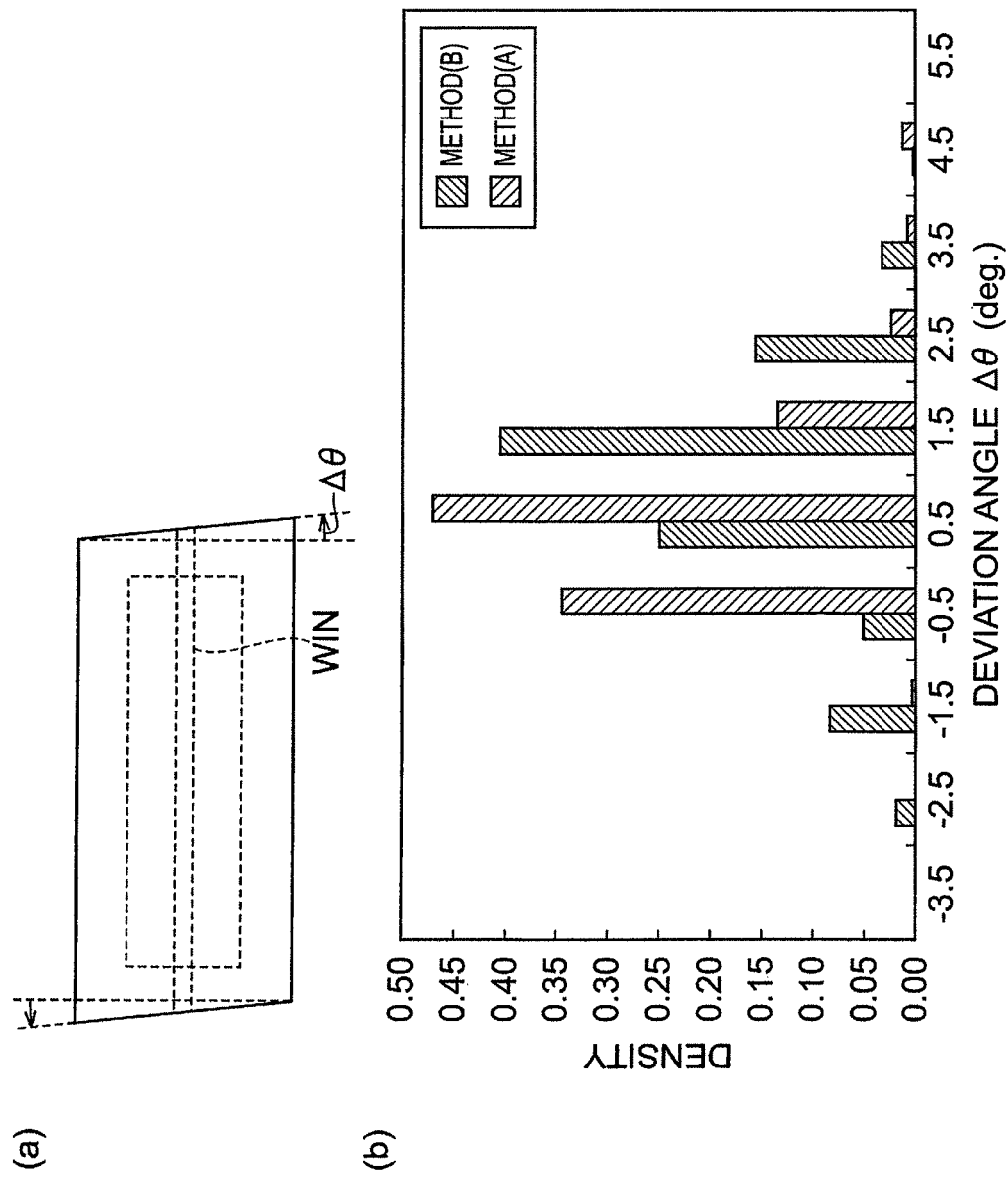
FIG. 11 is a drawing showing distributions of angles between fractured faces and laser stripes for laser cavities fabricated by method (A).

For the laser bars produced by method (A) and method (B) above, angular deviation of the cavity mirrors is measured with an optical microscope. The semiconductor epitaxial region including a plurality of semiconductor epitaxial films is grown on the substrate in the substrate product. In lasing, light traveling back and forth in the cavity propagates mainly in the semiconductor epitaxial region. For this reason, the measurement of the angular deviation of the cavity mirrors is carried out by estimating angular deviation of a cross section of the semiconductor epitaxial region appearing in the fractured face, as shown in part (a) of FIG. 11. In part (a) of FIG. 11, in order to show the position of the stripe waveguide, a window WIN shown in FIG. 10 is indicated by a dashed line. Part (b) of FIG. 11 is a histogram showing a relation of distributions of angular deviation with the methods of producing a laser bar. The horizontal axis represents deviation angle Δθ of cavity mirrors with respect to the direction perpendicular to the direction of the stripe waveguide in the semiconductor epitaxial region. It is shown by the measurement results that the center of the distribution of angular deviation of the cavity mirrors in the laser bar produced by method (A) is closer to the angle of zero than that in the laser bar by method (B). The averages and standard deviations of angular deviations of the laser mirrors in the laser bars produced by methods (A) and (B) are as described below.

| Method, | Average (deg.), | Standard deviation (deg.) |
|---|---|---|
| Method (A), | 0.42, | 0.93; |
| Method (B), | 1.02, | 1.26; |

It is seen from this result that when the laser bar is produced by method (A), the cavity mirrors with small angular deviation (distribution with the center of deviation angle being zero) can be stably formed. The vertical axis represents density, which is defined by (count in each angular range)/(total count).

Method (A):

| Deviation angle (deg.), | Count, | Density. |
|---|---|---|
| −4.5, | 0, | 0.00; |
| −3.5, | 0, | 0.00; |
| −2.5, | 0, | 0.00; |
| −1.5, | 1, | 0.00; |
| −0.5, | 82, | 0.34; |
| +0.5, | 112, | 0.47; |
| +1.5, | 32, | 0.13; |
| +2.5, | 6, | 0.03; |
| +3.5, | 2, | 0.01; |
| +4.5, | 3, | 0.01; |
| +5.5, | 0, | 0.00. |

Method (B):

| Deviation angle (deg.), | Count, | Density. |
|---|---|---|
| −4.5, | 0, | 0.00; |
| −3.5, | 0, | 0.00; |

-continued

| Deviation angle (deg.), | Count, | Density. |
|---|---|---|
| −2.5, | 7, | 0.02; |
| −1.5, | 31, | 0.08; |
| −0.5, | 19, | 0.05; |
| +0.5, | 93, | 0.25; |
| +1.5, | 151, | 0.41; |
| +2.5, | 58, | 0.16; |
| +3.5, | 12, | 0.03; |
| +4.5, | 1, | 0.00; |
| +5.5, | 0, | 0.00. |

Furthermore, evaluation by energization is carried out at room temperature, for the laser bars produced by methods (A) and (B). A power supply used herein is a pulsed power source with the pulse width of 500 ns and the duty ratio of 0.1%, and the energization is implemented with needles on the surface electrodes. On the occasion of light output measurement, the emission from the laser bar end face is detected with a photodiode to check the current-optical output characteristic (I-L characteristic).

Figure 12:
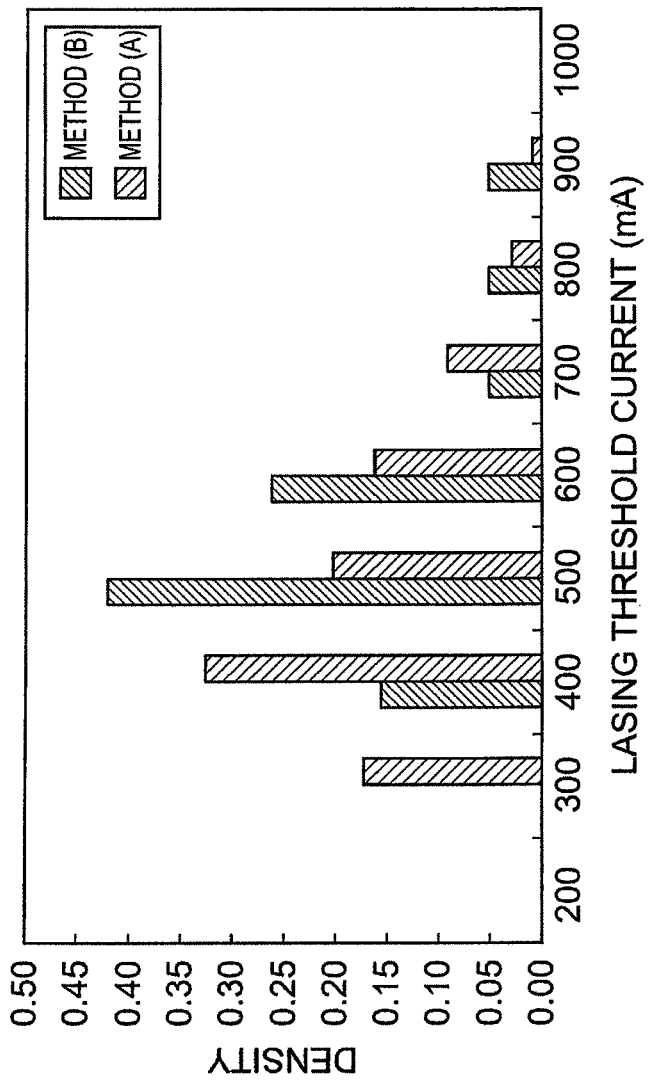
FIG. 12 is a drawing showing distributions of lasing threshold currents of semiconductor lasers including laser cavities fabricated by method (A) and method (B).

FIG. 12 is a histogram of distributions of lasing threshold currents in the laser bars produced by methods (A) and (B). Averages of lasing threshold currents of the bars produced by methods (A) and (B) are calculated from the distributions of lasing threshold currents, and are the following values.
Method (A): 484 mA.
Method (B): 554 mA.

It is seen from this result that when the laser bar is produced by method (A), the lasing threshold current can be reduced. This is considered to be the result of improvement in perpendicularity and flatness of the cavity mirrors by method (A). The vertical axis represents density, which is defined by the same definition as in FIG. 11. "Ith (mA)" indicates the threshold current in milliampere unit.
Method (A):

| Ith (mA), | Count, | Density. |
|---|---|---|
| 200, | 0, | 0.00; |
| 300, | 17, | 0.17; |
| 400, | 32, | 0.33; |
| 500, | 20, | 0.20; |
| 600, | 16, | 0.16; |
| 700, | 9, | 0.09; |
| 800, | 3, | 0.03; |
| 900, | 1, | 0.01; |
| 1000, | 0, | 0.00. |

Method (B):

| Ith (mA), | Count, | Density. |
|---|---|---|
| 200, | 0, | 0.00; |
| 300, | 0, | 0.00; |
| 400, | 3, | 0.16; |
| 500, | 8, | 0.42; |
| 600, | 5, | 0.26; |
| 700, | 1, | 0.05; |
| 800, | 1, | 0.05; |
| 900, | 1, | 0.05; |
| 1000, | 0, | 0.00. |

Figure 13:
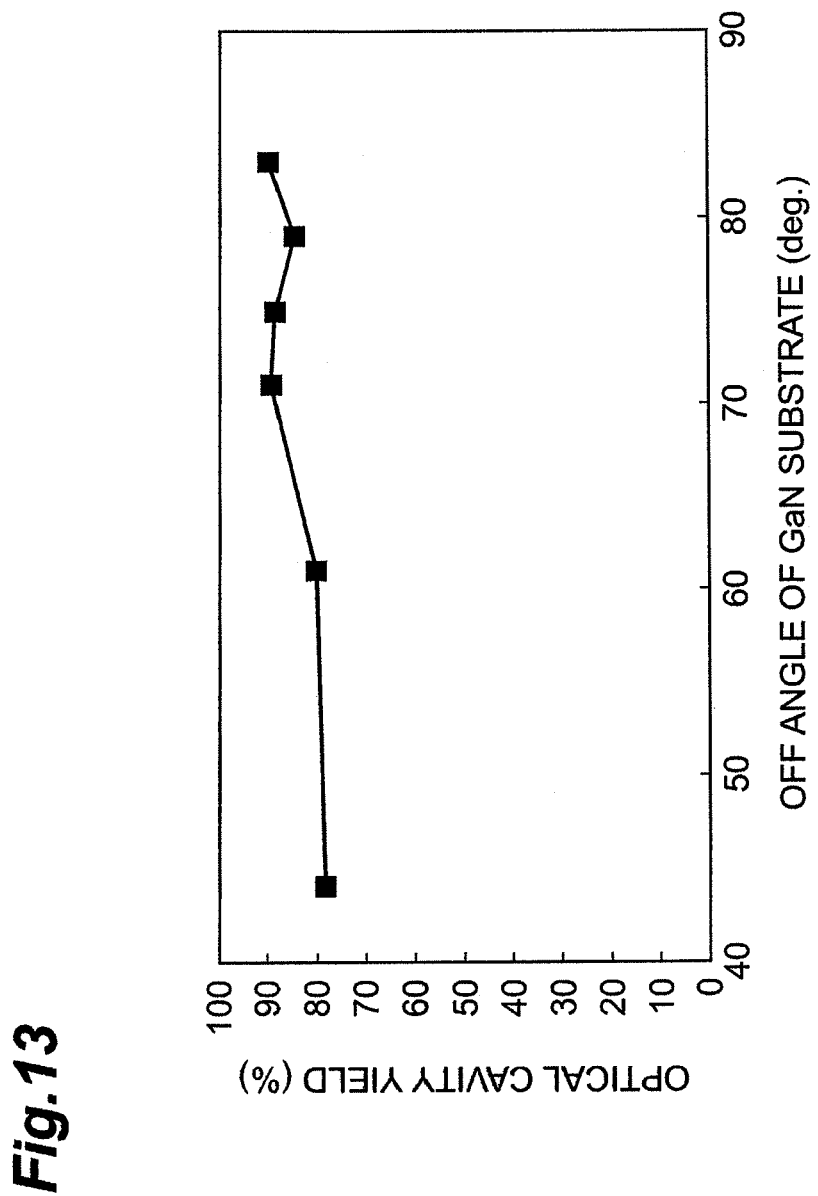
FIG. 13 is a drawing showing a relation of inclination angle of the c-axis toward the m-axis of GaN substrate versus cavity yield.

FIG. 13 is a drawing showing a relation of the inclination angle ALPHA (off-axis angle) of the c-axis toward the m-axis of the GaN substrate versus cavity yield. In the present example, the cavity yield is defined as (the number of cavities with the deviation angle in the epitaxial surface of not more than 1 degree)/(the total number of cavities subjected to the measurement of deviation angle). It is seen from FIG. 13 that no significant variation is shown in cavity yield when the semipolar surface has the off-axis angle in the range of 45 degrees to 80 degrees is used.

| Off angle (deg.), | Yield (%). |
|---|---|
| 44, | 78.5; |
| 61, | 80.4; |
| 71, | 89.3; |
| 75, | 88.7; |
| 79, | 84.7; |
| 83, | 90.2. |

Figure 14:
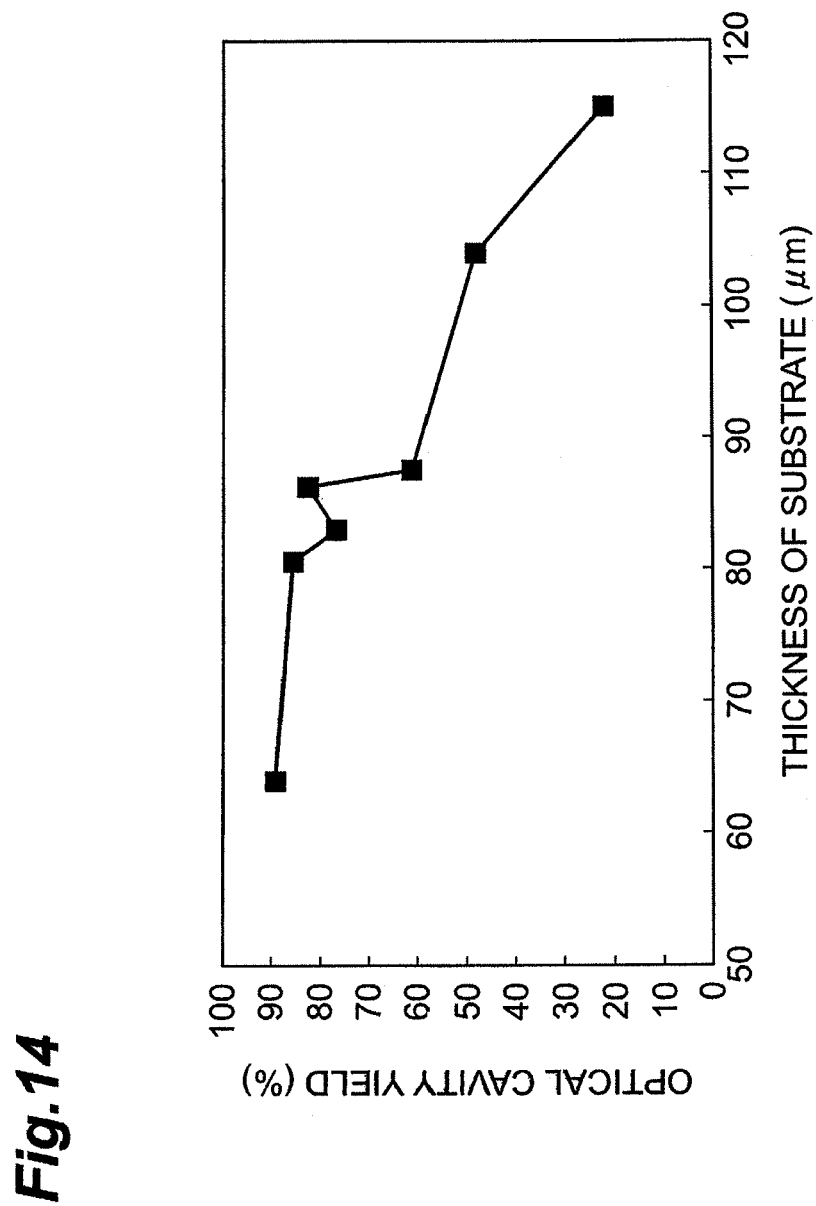
FIG. 14 is a drawing showing a relation of substrate thickness versus cavity yield.

FIG. 14 is a drawing showing a relation of substrate thickness versus cavity yield. With reference to FIG. 14, when the thickness of the substrate product is smaller than 50 µm, the laser bar can be more likely to be broken because handling does not become easy. According to Inventors' knowledge, when the thickness of the substrate produce is not less than 50 µm, the handling is possible without significant difficulty. The laser bar can be produced when the thickness of the substrate product is up to 115 µm. As the thickness increases over 100 µm, the cavity yield starts decreasing. From this experiment and other results, the thickness of the substrate product is preferably in the range of not less than 50 µm and not more than 100 µm.

| Thickness (µm), | Yield (%). |
|---|---|
| 64, | 89.1; |
| 81, | 85.5; |
| 83, | 76.5; |
| 86, | 82.5; |
| 88, | 61.0; |
| 104, | 48.1; |
| 115, | 21.9. |

The end faces of the laser bar are coated with a dielectric multilayer film by vacuum vapor deposition. The dielectric multilayer film is composed of an alternate stack of $SiO_2$ and $TiO_2$. The thickness of each layer is adjusted in the range of 50 to 100 nm and is designed so that the center wavelength of reflectance falls within the range of 500 to 530 nm. The reflecting surface on one side has ten cycles and the designed value of reflectance of about 95%, and the reflecting surface on the other side has six cycles and the designed value of reflectance of about 80%.

Evaluation by energization is carried out at room temperature. A power supply used is a pulsed power source with the pulse width of 500 ns and the duty ratio of 0.1% and the energization was implemented with needles on the surface electrodes. On the occasion of light output measurement, the emission from the laser bar end face is detected with a photodiode to check the current-optical output characteristic (I-L characteristic). In measurement of emission wavelength, the emission from the laser bar end face is made to pass through an optical fiber, and a spectrum thereof is measured with a spectrum analyzer as a detector. In checking a polarization state, the emission from the laser bar is made to pass through a polarizing plate to rotate, thereby checking the polarization state. In observation of LED-mode emission, an optical fiber is arranged on the front surface side of the laser bar to measure light emitted from the front surface.

The polarization state in a lasing state is checked for every laser, and it is found that the light is polarized in the a-axis direction. The lasing wavelength is in the range of 500-530 nm.

Figure 15:
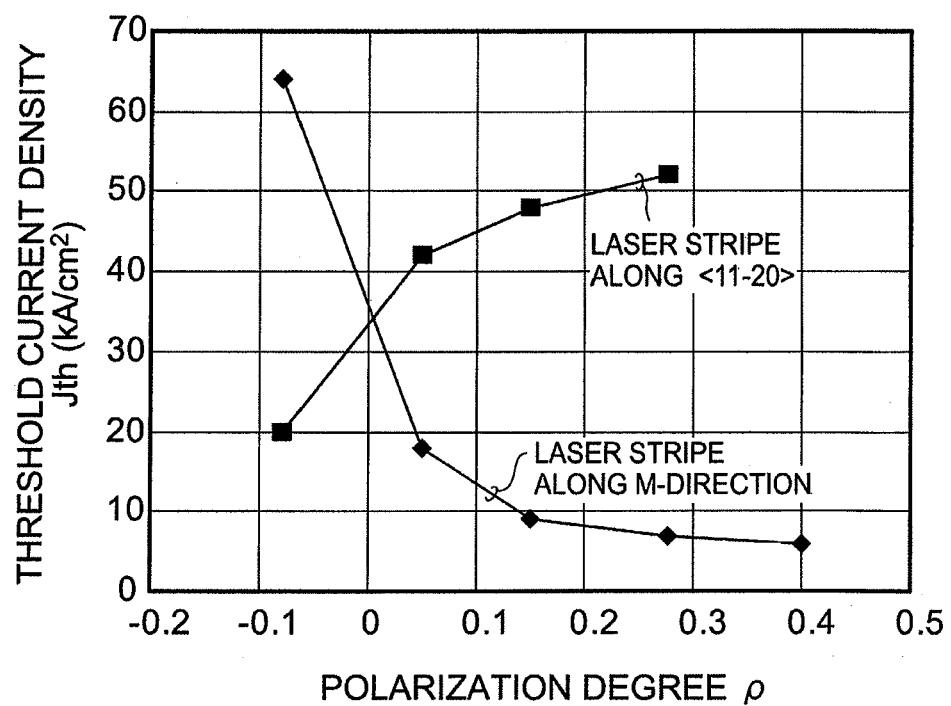
FIG. 15 is a drawing showing a relation of determined polarization degree ρ versus threshold current density.

The polarization state in the LED mode (spontaneous emission) is measured for every laser. When the polarization component in the a-axis direction is I1 and the polarization component in the direction in which the m-axis is projected onto the primary surface is I2, the polarization degree ρ is defined as (I1−I2)/(I1+I2). In this way, the relation between determined polarization degree ρ and minimum of threshold current density is investigated, and the result obtained is as shown in FIG. 15. It is seen from FIG. 15 that the threshold current density demonstrates a significant decrease in the case of the laser (1) with the laser stripe along the M-direction when the polarization degree is positive. Namely, it is seen that when the polarization degree is positive (I1>I2) and when the waveguide is provided along an off direction, the threshold current density is significantly decreased.

Example 3

In Example 2, the plural epitaxial films for the semiconductor laser are grown on the GaN substrate having the {20-21} surface. As described above, the end faces for the optical cavity are formed by the formation of scribed grooves and the press. In order to find candidates for these end faces, plane orientations making an angle near 90 degrees to the (20-21) plane and being different from the a-plane are determined by calculation. With reference to FIG. 14, the following angles and plane orientations have angles near 90 degrees with reference to the (20-21) plane.

| Specific plane index | Angle to {20-21} plane |
| --- | --- |
| (-1016): | 92.46 degrees; |
| (-1017): | 90.10 degrees; |
| (-1018): | 88.29 degrees. |

Figure 16:
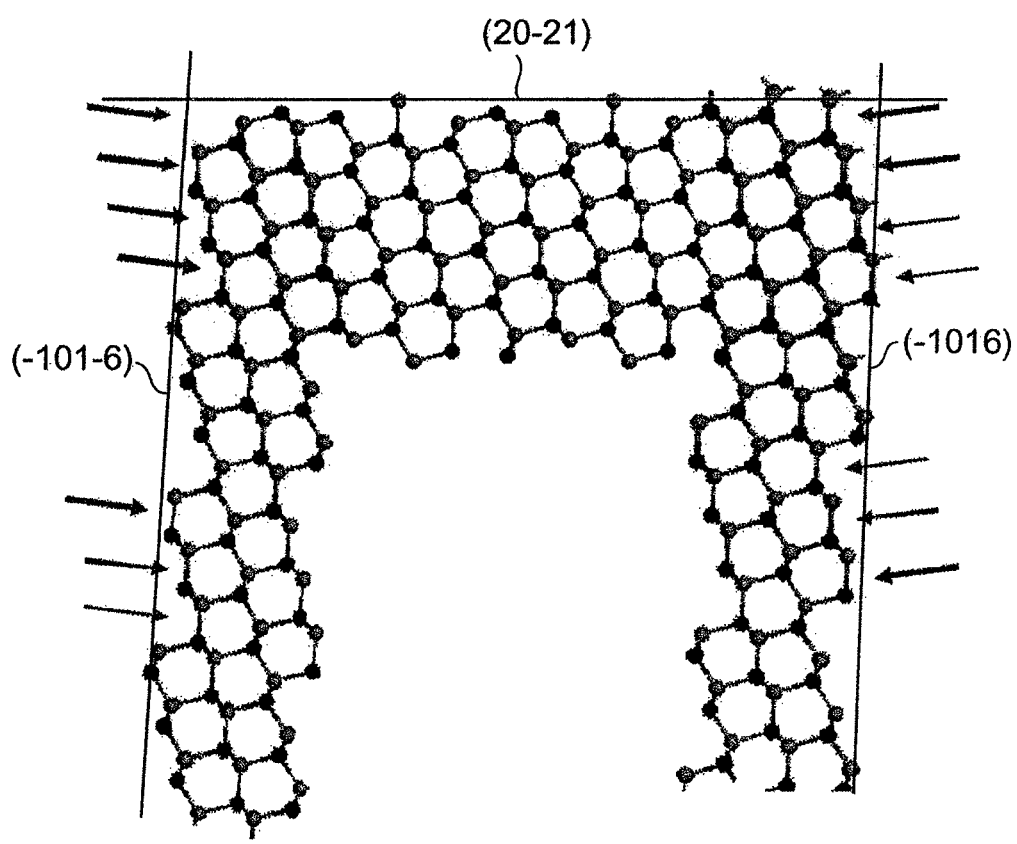
FIG. 16 is a drawing showing atomic arrangements in (20-21) plane, (-101-6) plane, and (-1016) plane.
Figure 17:
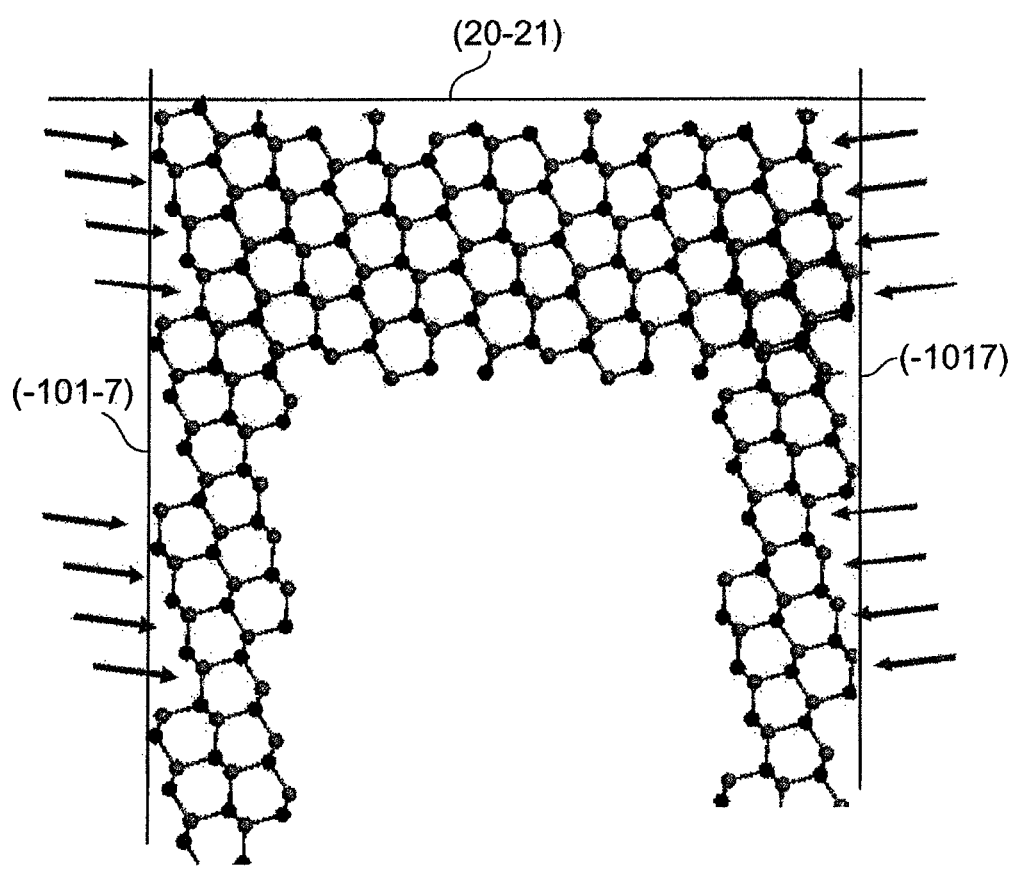
FIG. 17 is a drawing showing atomic arrangements in (20-21) plane, (-101-7) plane, and (-1017) plane.
Figure 18:
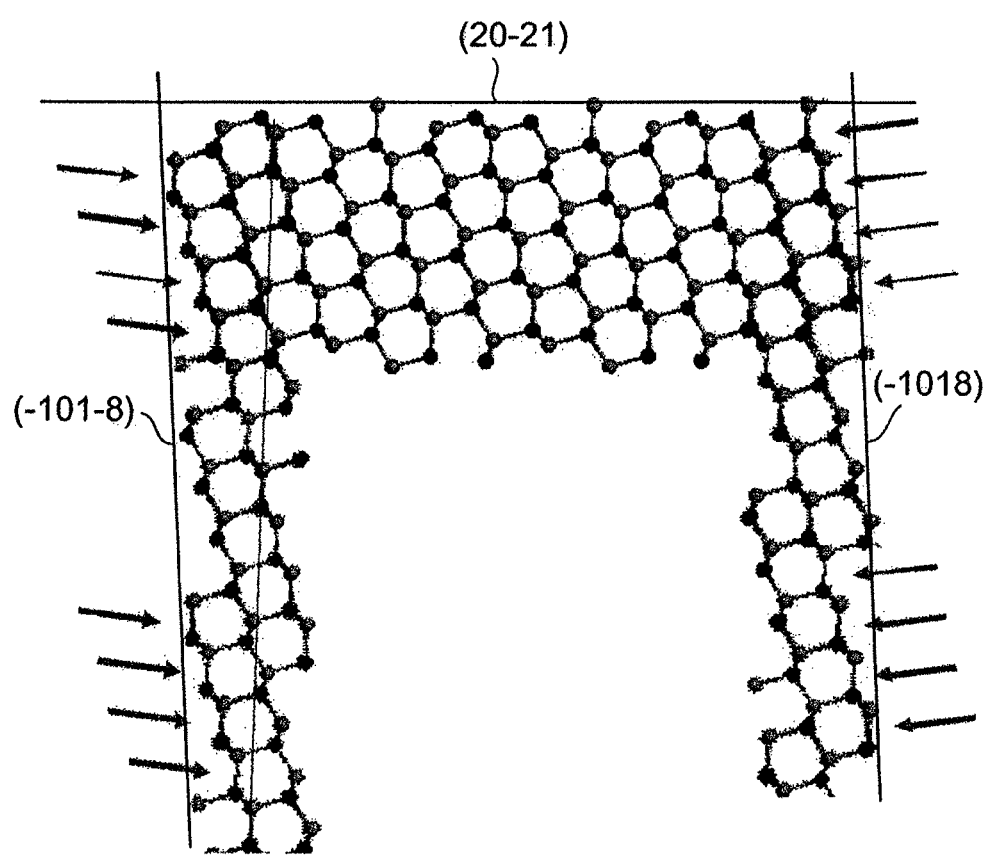
FIG. 18 is a drawing showing atomic arrangements in (20-21) plane, (-101-8) plane, and (-1018) plane.

FIG. 16 is a drawing showing arrangements of atoms in the (20-21) plane, (-101-6) plane, and (-1016) plane. FIG. 17 is a drawing showing arrangements of atoms in the (20-21) plane, (-101-7) plane, and (-1017) plane. FIG. 18 is a drawing showing arrangements of atoms in the (20-21) plane, (-101-8) plane, and (-1018) plane. As shown in FIGS. 16 to 18, local arrangements of atoms indicated by arrows show configurations of neutral atoms in terms of charge, and electrically neutral arrangements of atoms appear periodically. The reason why the relatively normal faces are obtained to the growth surface can be that generation of fractured faces is considered to be relatively stable because of the periodic appearance of the neutral atomic configurations in terms of charge.

According to various experiments including the above-described Examples 1 to 3, the angle ALPHA can be in the range of not less than 45 degrees and not more than 80 degrees or in the range of not less than 100 degrees and not more than 135 degrees. In order to improve the lasing chip yield, the angle ALPHA can be in the range of not less than 63 degrees and not more than 80 degrees or in the range of not less than 100 degrees and not more than 117 degrees. The typical semipolar primary surface can be any one of the {20-21} plane, {10-11} plane, {20-2-1} plane, and {10-1-1} plane. Furthermore, the primary surface can be a slight slant surface from these semipolar planes. The semipolar primary surface can be, for example, a slight slant surface off in the range of not less than −4 degrees and not more than +4 degrees toward the m-plane from any one of the {20-21} plane, {10-11} plane, {20-2-1} plane, and {10-1-1} plane.

The embodiment provides the III-nitride semiconductor laser device with the laser cavity enabling the reduction of threshold current, on the semipolar surface of the support base inclined from the c-axis toward the m-axis of the hexagonal III-nitride. The embodiment also provides the method of fabricating the III-nitride semiconductor laser, which can improve the flatness of the cavity mirrors in the III-nitride semiconductor laser device and which can reduce the threshold current.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A method of fabricating a III-nitride semiconductor laser device, comprising the steps of:
preparing a substrate product, the substrate product having a laser structure, the laser structure including a semiconductor region and a substrate of a hexagonal III-nitride semiconductor, the substrate having a semipolar primary surface, and the semiconductor region being formed on the semipolar primary surface;
scribing a first surface of the substrate product to form a scribed mark, the scribed mark extending in a direction of an a-axis of the hexagonal III-nitride semiconductor; and
after forming the scribed mark, carrying out breakup of the substrate product by press against a second region of the substrate product while supporting a first region of the substrate product but not supporting the second region thereof, to form another substrate product and a laser bar,
the substrate product being divided into the first region and the second region by a predetermined reference line,
the first and second regions being adjacent to each other,
the press being implemented against a second surface of the substrate product,
the first surface being opposite to the second surface,
the semiconductor region being located between the first surface and the substrate,
the laser bar having first and second end faces, the first and second end faces extending from the first surface to the second surface and being made by the breakup,
the first and second end faces constituting a laser cavity of the III-nitride semiconductor laser device,
the substrate product including an anode electrode and a cathode electrode, the anode electrode and the cathode electrode being provided on the laser structure,
the semiconductor region including a first cladding layer comprised of a first conductivity type GaN-based semiconductor, a second cladding layer comprised of a second conductivity type GaN-based semiconductor, and an active layer provided between the first cladding layer and the second cladding layer,
the first cladding layer, the second cladding layer, and the active layer being arranged along an axis normal to the semipolar primary surface,
a c-axis of the hexagonal III-nitride semiconductor of the substrate being inclined at an angle ALPHA with respect to the normal axis toward an m-axis of the hexagonal III-nitride semiconductor, and the first and second end faces intersecting with an m-n plane defined by the normal axis and the m-axis of the hexagonal III-nitride semiconductor.

2. The method according to claim 1, wherein the angle ALPHA is in one of a range of not less than 45 degrees and not more than 80 degrees and a range of not less than 100 degrees and not more than 135 degrees.

3. The method according to claim 1, wherein the angle ALPHA is in one of a range of not less than 63 degrees and not more than 80 degrees and a range of not less than 100 degrees and not more than 117 degrees.

4. The method according to claim 1, wherein the scribed mark extends in a direction from the first surface to the second surface along an a-n plane defined by the normal axis and the direction of the a-axis.

5. The method according to claim 1, wherein
in the step of forming the substrate product, the substrate is processed such that a thickness of the substrate becomes not less than 50 μm,
the processing is one of slicing and grinding, and
the second surface is one of the following surfaces: a processed surface made by the processing; and a surface including an electrode formed on the processed surface.

6. The method according to claim 1, wherein
the scribing is carried out using a laser scriber,
the scribed mark includes a scribed groove, and
the scribed groove extends in a direction from the first surface to the second surface along an a-n plane defined by the normal axis and the direction of the a-axis.

7. The method according to claim 1, wherein the semipolar primary surface has a slant toward an m-plane in a range of not less than −4 degrees and not more than +4 degrees with respect to any one semipolar plane of a {20−21} plane, a {10−11} plane, a {20−2−1} plane, and a {10−1−1} plane.

8. The method according to claim 1, wherein the semipolar primary surface is any one of a {20−21} plane, a {10−11} plane, a {20−2−1} plane, and a {10−1−1} plane.

9. The method according to claim 1, wherein the substrate comprises any one of GaN, AlGaN, AlN, InGaN, and InAlGaN.

10. The method according to claim 1, wherein an end face of the active layer in each of the first and second end faces makes an angle in a range of not less than (ALPHA−5) degrees and not more than (ALPHA+5) degrees on a first plane with respect to a reference plane perpendicular to the m-axis of the substrate, and the first plane is defined by the c-axis and the m-axis of the hexagonal III-nitride semiconductor.

11. The method according to claim 10, wherein the angle is in a range of not less than −5 degrees and not more than +5 degrees on a second plane perpendicular to the first plane and the normal axis.

* * * * *